United States Patent
Welch et al.

(10) Patent No.: US 11,523,483 B2
(45) Date of Patent: Dec. 6, 2022

(54) MAINTAINING SENSING STATE OF A SENSOR AND CONTROLLING RELATED LIGHT EMISSION

(71) Applicant: Amazon Technologies, Inc., Seattle, WA (US)

(72) Inventors: Gerald A. Welch, San Jose, CA (US); Sreeraman Anantharaman, Los Altos, CA (US); Giancarlo Montemurro, San Francisco, CA (US); Jeffrey Alexander Mehlman, Pleasanton, CA (US)

(73) Assignee: Amazon Technologies, Inc., Seattle, WA (US)

( * ) Notice: Subject to any disclaimer, the term of this patent is extended or adjusted under 35 U.S.C. 154(b) by 134 days.

(21) Appl. No.: 17/080,218

(22) Filed: Oct. 26, 2020

(65) Prior Publication Data
US 2022/0132636 A1    Apr. 28, 2022

(51) Int. Cl.
*H05B 45/30*  (2020.01)
*H05B 47/11*  (2020.01)
*H04R 3/00*   (2006.01)
*H04R 1/08*   (2006.01)
*G01R 19/165* (2006.01)
*G01R 31/26*  (2020.01)
(Continued)

(52) U.S. Cl.
CPC .......... *H05B 45/30* (2020.01); *G01R 19/1659* (2013.01); *G01R 31/2635* (2013.01); *G06F 3/165* (2013.01); *H04R 1/08* (2013.01); *H04R 3/00* (2013.01); *H04R 29/004* (2013.01); *H05B 47/11* (2020.01)

(58) Field of Classification Search
CPC ........... H05B 45/30; H05B 47/11; G06F 3/16; G06F 3/165; H04R 1/08; H04R 1/1041; H04R 29/008; H04R 3/00; H04R 29/004
See application file for complete search history.

(56) References Cited

U.S. PATENT DOCUMENTS

| 10,354,655 B1* | 7/2019 | White | H04W 4/80 |
| 2015/0097666 A1* | 4/2015 | Boyd | G01J 1/4204 |
| | | | 340/517 |

(Continued)

FOREIGN PATENT DOCUMENTS

WO    2020159653    8/2020

OTHER PUBLICATIONS

"I2S Bus Specification," Philips Semiconductors, Feb. 1986, Revised Jun. 5, 1996, 7 pages.
(Continued)

*Primary Examiner* — Abdullah A Riyami
*Assistant Examiner* — Syed M Kaiser
(74) *Attorney, Agent, or Firm* — Kilpatrick Townsend & Stockton LLP

(57) ABSTRACT

Techniques are described for controlling a sensing state of a device. In an example, a controller of the device stores, in a memory of the controller, first state data indicating a state of a sensor, the state being enabled. The controller, receives first input data indicating a request to disable the sensor. The controller determines that the sensor is enabled based at least in part on the first state data. Further, the controller causes the sensor to be disabled and stores, in the memory, second state data indicating that the sensor is disabled. The controller sends, to a processor, first output data indicating that the sensor is disabled.

20 Claims, 17 Drawing Sheets

(51) Int. Cl.
 *G06F 3/16* (2006.01)
 *H04R 29/00* (2006.01)

(56) References Cited

U.S. PATENT DOCUMENTS

| | | | |
|---|---|---|---|
| 2015/0159846 A1* | 6/2015 | Hollinger | F21V 33/008 |
| | | | 362/183 |
| 2016/0146903 A1* | 5/2016 | Yang | G01R 33/022 |
| | | | 324/244 |
| 2016/0345087 A1 | 11/2016 | Cox | |
| 2017/0273662 A1* | 9/2017 | Baym | G16H 50/30 |
| 2017/0273663 A1* | 9/2017 | Baym | A61B 8/54 |
| 2019/0159034 A1* | 5/2019 | Zeiler | H04W 4/029 |
| 2019/0340906 A1* | 11/2019 | Williams | G08B 21/0277 |
| 2020/0029143 A1 | 1/2020 | Cox | |
| 2020/0260186 A1* | 8/2020 | Stachura | G10L 15/22 |
| 2020/0364991 A1* | 11/2020 | Scalisi | G08B 13/19619 |
| 2021/0377587 A1* | 12/2021 | Ekanayake | H04L 63/0227 |

OTHER PUBLICATIONS

WO Application No. PCT/US2021/056155, International Search Report and Written Opinion, dated Feb. 14, 2022, 12 pages.

\* cited by examiner

MAINTAINING SENSING STATE OF A SENSOR AND CONTROLLING RELATED LIGHT EMISSION

BACKGROUND

A computing device can have various modalities for user interaction. Depending on the modalities, different types of user inputs can be received and processed to support different types of functionalities of the computing device. For example, a computing device can be a smart speaker that includes a microphone. The microphone can detect and send natural language utterances of a user to an audio processor of the computing device for control of, for instance, a volume of the smart speaker or other functionalities thereof. In another example, the computing device includes the smart speaker, a camera, a display. In a two-way communication session, the camera can generate and send a video of the user to another remote device. Further, the display can present video received from the remote device. Such computing devices and other computing device types can include buttons to enable and disable the different modalities.

BRIEF DESCRIPTION OF THE DRAWINGS

Various embodiments in accordance with the present disclosure will be described with reference to the drawings, in which.

DETAILED DESCRIPTION

Figure 1:
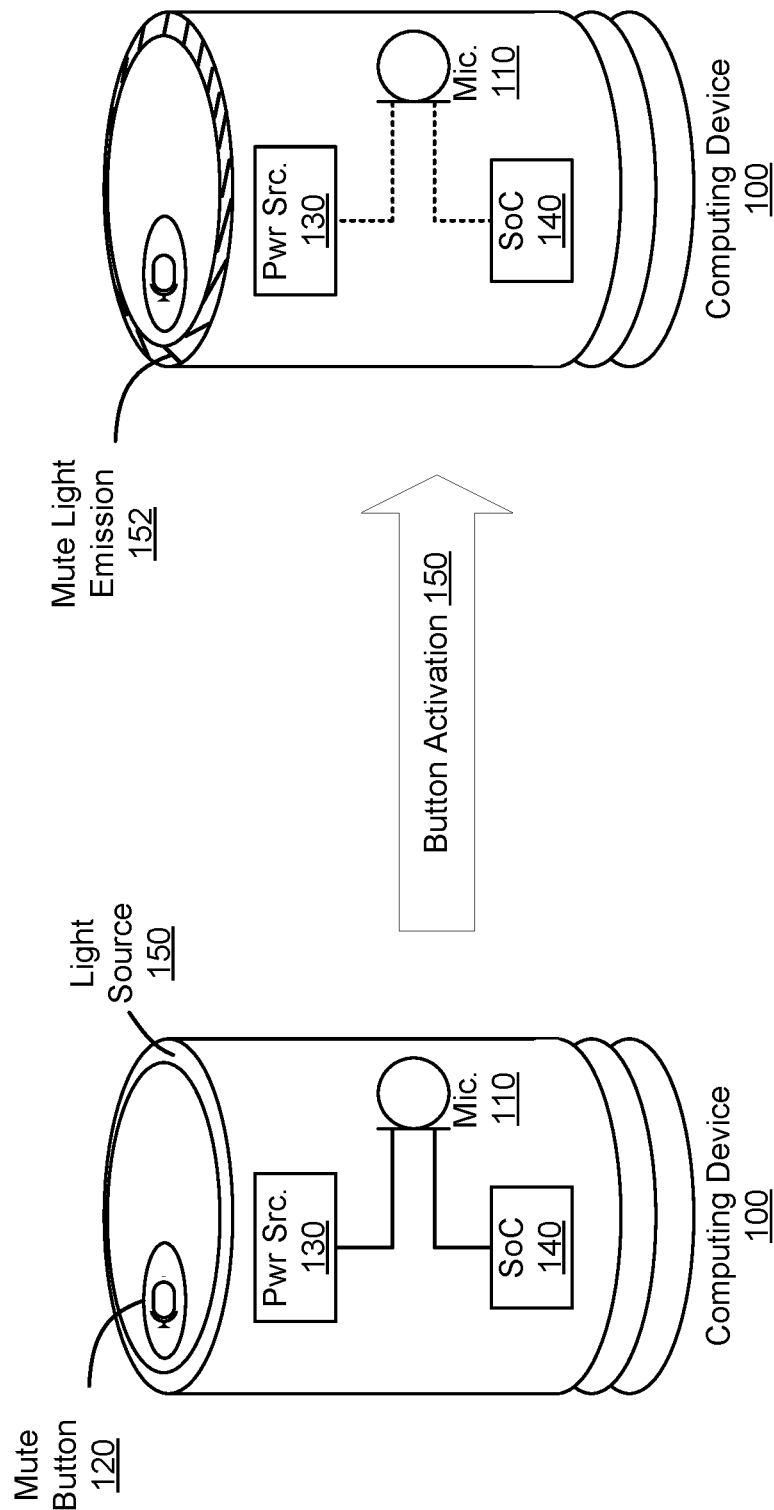
FIG. 1 illustrates an example of a computing device that includes a sensor and a button for controlling a sensing state of the computing device, according to embodiments of the present disclosure.

In the following description, various embodiments will be described. For purposes of explanation, specific configurations and details are set forth to provide a thorough understanding of the embodiments. However, it will also be apparent to one skilled in the art that the embodiments may be practiced without the specific details. Furthermore, well-known features may be omitted or simplified as not to obscure the embodiment being described.

Embodiments of the present disclosure are directed to, among other things, controlling a sensing state of a computing device and a related indication about the sensing state. In an example, the computing device includes a sensor, a button that can enable or disable the sensor, a processor that can process data sensed by the sensor, a light source that can emit light based on the sensing state and/or processing of the processor, and a controller that can control at least the sensing state based on input data from the button, input data from the processor, and/or input data from the light source. Upon first input data of the button requesting the sensor to be disabled, the controller determines that the sensing state is currently set to enabled, disables the sensor, updates the sensing state to disabled, and indicates to the processor that the sensor is disabled. The controller and/or the processor can control the light source to emit a particular light that indicates that the sensor is disabled. As used herein, light emission refers to outputting, by a light source, a light pattern that can include outputting light of a single color or a combination of two or more colors, varying intensities of light, blinking lights, steady light, combination of blinking and steady light, and the like. Upon input data of the processor requesting the sensor to be re-enabled, the controller may ignore the request. In an example, the re-enabling can only be initiated via the button. In particular, upon second input data of the button requesting the sensor to be re-enabled, the controller determines that the sensing state is currently set to disabled, enables the sensor, updates the sensing state to enabled, and indicates to the processor that the sensor is enabled. The controller and/or the processor can control the light source to stop the light emission. While the sensor is enabled, the controller may receive a feedback signal from the light source indicating a voltage value at the light source. Upon determining that the voltage value is associated with light emission that indicates that the sensor is disabled and that the sensing state is currently set to enabled, the controller can disable the sensor, update the sensing state to disable, and indicate to the processor that the sensor is disabled.

To illustrate, consider an example of a smart speaker that includes a microphone, a light ring that includes light emitting diodes (LEDs), and a mute button operable to mute and unmute the microphone. In this example, the smart speaker also includes a controller and a processor. The light ring indicates that the microphone is muted by emitting a red light. No light emission is used when the microphone is unmuted. The SoC provides various audio processing functionalities including speech input processing. Upon an activation of the mute button, the controller detects the activation, determines that the sensing state is currently set to enabled, mutes the microphone, updates the sensing state to disabled, sends an interrupt to the processor that can then determine the mute state from the controller and terminates the speech input processing, and causes, via an LED driver, the LEDs to emit red light. The microphone can be unmuted in response to another activation of the microphone but may not be unmuted in response to a request of the processor. If unmuted, the controller updates the sensing state to enabled and instructs the LED driver to stop the red light emission. While in this state, the controller monitors a voltage value measured at cathodes of the LED. If the voltage value indicates that at least one, a subset, and/or the entire set of LEDs is emitting red light, the controller mutes the microphone and updates the mute state to disabled.

Embodiments of the present disclosure provide technological advantages over existing systems to control a sensing state of a computing device. In particular, by using a controller that is separate from a processor, security of the computing device can be improved. In particular, the processor is prevented from having controls over the re-enabling a sensor of the computing device when the sensing state is disabled. Instead, the controls are provided by the controller that maintains a sensing state given inputs from a button, the processor, and a light source. Hence, even when the processor is compromised (e.g., its software is hacked or includes a bug), the compromise does not affect how the sensing state can be controlled. Furthermore, by monitoring a voltage at the light source as one of the inputs, faults can be detected and mitigated. For instance, if the light source is emitting an indication that the sensing state is disabled, when in fact, the sensor is enabled, the controller can force the sensor to be disabled. These and other technological improvements are further described in connection with the next figures.

In the interest of clarity of explanation, various embodiments of the present disclosure are described in connection with a computing device that includes a microphone and/or a camera. However, the embodiments are not limited as such and apply to controlling the sensing state (e.g., enabling the sensing or disabling the sensing by one or more sensors of the computing device) of any type of sensors including, for instance, motion sensors, temperature sensors, Lidar sensors, and the like. Various embodiments of the present disclosure are also described in connection with a system on a chip (SoC) and a microcontroller of the computing device. However, the embodiments are not limited as such and apply to any type of processors and controllers of the computing device.

FIG. 1 illustrates an example of a computing device 100 that includes a sensor and a button for controlling a sensing state of the computing device 100, according to embodiments of the present disclosure. In this illustrative example, the sensor is a microphone 110 (although other types of sensors are equivalently possible) and the button is a mute button 120 to disable and enable the sensor (or, equivalently, mute and unmute the microphone 110). The disabling of the sensor, in this case muting the microphone 110, includes powering off the microphone 110 and blanking any audio data that would have otherwise been output by the microphone 110.

The computing device 100 also includes a power source 130, a SoC 140, and a light source 150 among other components. The power source 130 provides power to various components of the computing device 100. The power can be direct current (DC) power and the power source 130 and/or other components of the computing device 100 can include voltage converters, step-up transformers, step-down transformers, and the like to supply the proper power to the components of the computing device 100. The power can be supplied over different power lines, such as voltage rails, including a power line between the power source 130 and the microphone 110, and a power line between the power source 130 and the SoC 140. For instance, the power line to the microphone 110 delivers 3.3 volts DC (VDC). A same or a different voltage can be delivered to the SoC 140. The power source 130 can include rechargeable or disposable batteries and/or a receptacle to receive power from an external source, such as from a power outlet.

The SoC 140 can be an integrated circuit, such as a microchip, that integrates various computing components that provide some or all the functionalities of the computing device 110. These components can include a central processing unit (CPU), a memory and other data storages, analog to digital converters (ADCs), digital to analog converters (DACs,) network interface cards, and input/output ports. This and other potential hardware circuitry and/or software executed on such hardware circuitry provide the functionalities. For instance, the computing device 100 can be a smart speaker. In this case, the functionalities include wakeword detection, audio processing, communication with a backend server over a local area network, transmission and receipt of audio data, playing audio, and the like.

The SoC 140 and the microphone 110 can be coupled over a data line. The data line can carry audio data (digital or analog) from the microphone 110 to the SoC 140 for further processing, where the SoC 140 can execute an application that receives processed sensor data(e.g., a wakeword application to detect a wakeword, a communication application to transmit the audio data in a communication session with a remote computing device, and the like). For instance, the data line can be an I2S bus carrying I2S serial data, where the specification of the I2S bus is defined in the "I2S bus specification," Philips Semiconductors, Jun. 5, 1996, the content of which is incorporated by reference herein in its entirety.

The light source 150 can include a set of light emitting devices, such as a set of LEDs. The LEDs can be arranged in a ring, as shown in FIG. 1, of twenty-four red, blue, green (RGB) LEDs. An RGB LED can include a red LED, a green LED, and a blue LED. Other arrangements are also possible, such as a bar (e.g., a line that is vertical, horizontal, diagonal, etc.) of twelve RGB LEDs, or a dot (e.g., a circle) with six RGB LEDs. Of course, a different number of LEDs is possible. An LED driver can control the color and the intensity of light emitted by each RGB LED. Depending on the number of RGB LED, one or more LED drivers may be used.

In the illustration of FIG. 1, the computing device 100 has only one sensor: the microphone 110. In this case, the sensing state of the computing device 100 is the same as the sensing state of the microphone 110. In other words, if the sensor is enabled (the microphone 110 is unmuted), the sensing state of the computing device 100 is enabled (e.g., the computing device 100 is capable of receiving and processing audio sensed by the microphone 110). If the sensor is disabled (the microphone 110 is muted), the sensing state of the computing device 100 is disabled (e.g., the computing device 100 does not process audio of the microphone 110 because no audio is sensed by the microphone 110).

The mute button 120 can be a toggle switch. Upon a first activation, the sensing state can be changed from one state to another (e.g., from enabled to disabled). Upon a second activation, the sensing state can be changed back (e.g., from disabled to enabled). Other implementations of the mute button 120 are also possible including, for instance, a push button, a sliding button, and the like.

In an example, the mute button 120 is implemented as a push and hold button. Upon a push and hold of the button for a time duration smaller than a predefined time length (e.g., three seconds or some other time value), the microphones 110 is disabled. Upon a push and hold of the button for a time duration longer than the predefined time length, the microphone 110 is not automatically muted. Instead, for instance, a user notification is presented (e.g., via a speaker or a GUI) to confirm that the disable sensing state should be entered. Alternatively or additionally, the computing device 100 is powered up or down or is transitioned into or out of a low power mode. The mute button 120 can also be a software button displayed on a GUI based on an execution of a button application. In this case, the button application may not be executed on the SoC 140, and the activation of the software button can be via a click, a touch, or a swipe on the GUI.

In the sensing state of enabled (referred to herein as enabled sensing state), the microphone 110 is enabled and detects audio, including natural language utterances, white noise, background noise such as music, and the like, generates audio data based on the detection, and sends the audio data to the SoC 140. In the sensing state of disabled (referred to herein as disabled sensing state), the microphone 110 is disabled and does not to detect any audio and no audio data is sent from the microphone 110 to the SoC 140. Preventing the audio detection and audio data transmission in the disabled state can be performed by powering off the microphone 110 and/or blanking the output of the microphone 110 to the SoC 140. Blanking includes zeroing the audio data (e.g., setting all data bits to have a zero value in case of digital audio data (e.g., all data bits become "0" bits), or setting the voltage level to zero volts of audio data in case of analog audio data).

As illustrated in FIG. 1, in the enabled sensing state, the microphone 110 is coupled with the power source 130 over the power line and, thus, is powered on as illustrated with the solid line between the microphone 110 and the power source 130. Also in the enabled sensing state, the microphone 110 is coupled with the SoC 140 over the data line and, thus, outputs audio data to the SoC 140, as illustrated with the solid line between the microphone 110 and the SoC 140. The light source 150 does not emit light (e.g., red light) that indicates the disabled sensing state. The light emission indicating the disabling sensing state is referred to herein as mute light emission in the interest of clarity. Instead here, the SoC 140 can control the light emission (e.g., by emitting a blue light to indicate that detection of a wakeword and the reception of speech input). Nonetheless, and as further described in the next figures, the SoC 140 may not cause a light emission that resembles the mute light emission (e.g., a red light) that indicates the disabled sensing state (e.g., that the microphone 110 is muted).

Upon a button activation 150, the microphone 110 (or, equivalently, the computing device 100) is in the disabled sensing state. In the disabled sensing state, the microphone 110 is decoupled from the power source 130 as illustrated with the dotted line between the microphone 110 and the power source 130 (e.g., an open is created in the power line). Also, in the disabled sensing state, the output of the microphone 110 to the SoC 140 is blanked, as illustrated with the dotted line between the microphone 110 and the SoC 140. Here, the light source 150 emits light (e.g., red light) that indicates the disabled sensing state (shown as mute light emission 152 in FIG. 1). The SoC 140 may not change the mute light emission and is prevented from unmuting the microphone 110. To unmute the microphone 110 (e.g., re-enter the enabled sensing state), the mute button 120 can be activated again.

The use of mute light emission is one example for indicating the sensing state (e.g., whether enabled or disabled). However, embodiments of the present disclosure are not limited as such. Other output modalities to indicate the sensing state are possible. The light source 150 is an example of a user interface that indicates the sensing state. Of course, other types of user interfaces are possible including, for instance, an audio interface (e.g., a speaker that plays a particular chime to indicate the sensing state) and/or a graphical user interface (GUI) that displays a notification to indicate the sensing state. Additionally or alternatively, the mute button 120 may include a light source that indicates the sensing state. Further, a sensing state indicator (e.g., a light source or otherwise), can be disposed around and/or in vicinity of the mute button, can be located at a particular location in the computing device 100 (e.g., at a top surface), and/or can be distributed along one or more surfaces (e.g., as an external ring around the top surface), and/or can be separate from and coupled with the computing device 100.

Figure 2:
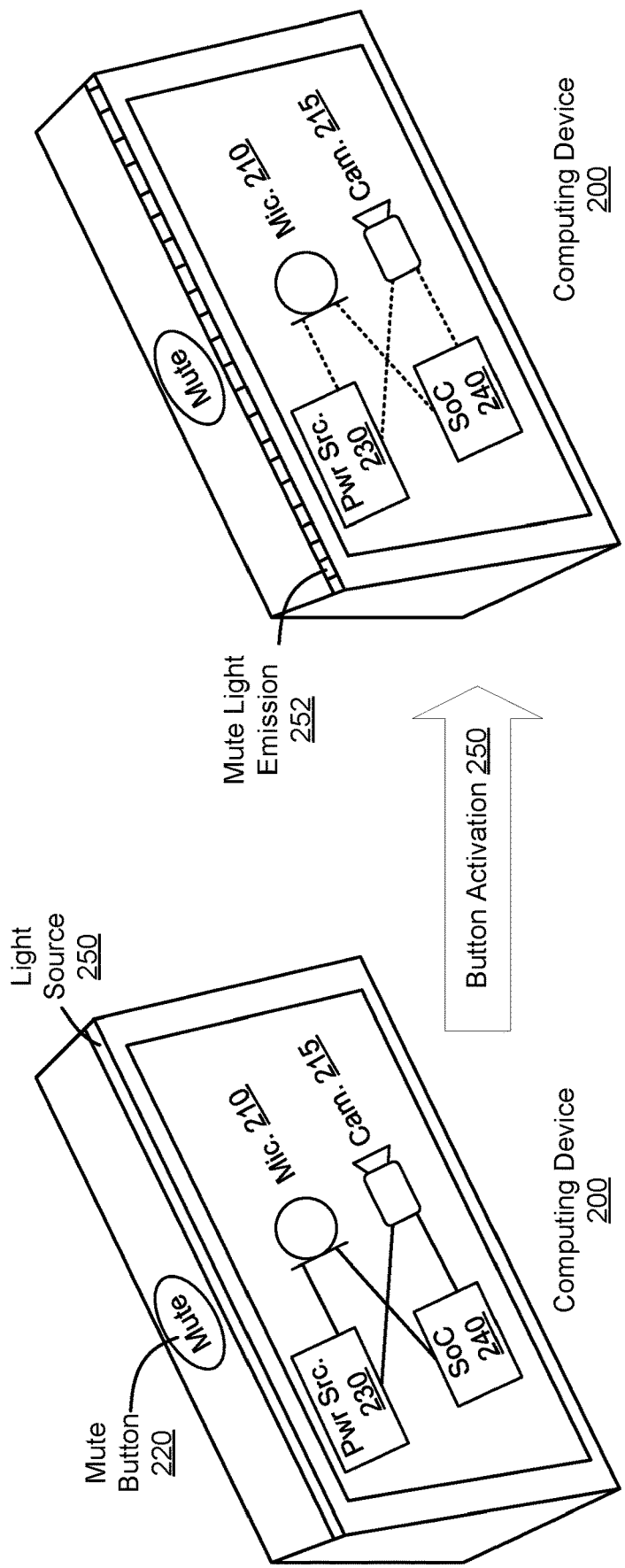
FIG. 2 illustrates an example of a computing device that includes multiple sensors and a button for controlling a sensing state of the computing device, according to embodiments of the present disclosure.

FIG. 2 illustrates an example of a computing device 200 that includes multiple sensors and a button for controlling a sensing state of the computing device, according to embodiments of the present disclosure. In this illustrative example, the computing device 200 includes two sensors: a microphone 210 and a camera 215 (e.g., a set of CMOS sensors and relevant circuitry), although a different number and other types of sensors are equivalently possible. The button disables and enables the sensing state of the computing device 200. In the illustration of FIG. 2, the button is a mute button 220 to mute (e.g., disable) the microphone 210 and the camera 215 upon a first activation of the mute button 220 and to unmute (e.g., enable) the microphone 210 and the camera 215 upon a second activation of the mute button 220. The muting includes powering off the microphone 210 and the camera 215 and blanking any audio data and video data that would have otherwise been output by the microphone 210 and the camera 215, respectively. The microphone 210 and the camera 215 can support, for instance, an audio and video communication session with a remote device, where audio data and video data can be transmitted to the remote device and where audio data and video data can be received from the remote device and presented at the computing device 200 (e.g., via a speaker and a display of the computing device 200).

The computing device 200 also includes a power source 230, an SoC 240, and a light source 250, among other components. The power source 230 provides power to various components of the computing device 200. The power can be DC power and the power source 240 and/or other components of the computing device 200 can include voltage converters, step-up transformers, step-down transformers, and the like to supply the proper power to the components of the computing device 200. The power can be supplied over different power lines, such as voltage rails, including a first power line between the power source 230 and the microphone 210, a second power line between the power source 243 and the camera 215, and a power line between the power source 230 and the SoC 240. For instance, the first power line to the microphone 210 delivers 3.3 VDC. The second power line to the camera 215 delivers 5 VDC. The power source 230 can include rechargeable or disposable batteries and/or a receptacle to receive power from an external source, such as from a power outlet.

The SoC 240 can be an integrated circuit, such as a microchip, that integrates various computing components that provide some or all the functionalities of the computing device 200, including the audio data and video data processing, transmission, reception, and presentation.

The SoC 240 and the microphone 210 can be coupled over a first data line. The first data line can carry audio data (digital or analog) from the microphone 210 to the SoC 240 for further processing where the SoC 140 can execute an application that receives processed sensor data (e.g., a wakeword application to detect a wakeword, a communication application to transmit audio/video data in a communication session with a remote computing device, an object recognition application to detect an object in video data, and the like). For instance, the first data line can be an I2S bus carrying I2S serial data. The SoC 240 and the camera 215 can also be coupled over a second data line. The second data line can carry video data (digital or analog) from the camera 215 to the SoC 240 for further processing (e.g., to detect that an object is present in the video data, to transmit the video data in a communication session with the remote computing device, and the like). For instance, the second data line can be a video interconnect bus that supports different compression formats including MPEG-4.

The light source 250 can include a set of light emitting devices, such as a set of LEDs. The LEDs can be arranged in a bar, as show in FIG. 2, of twenty-four RGB LEDs. Other arrangements are also possible, such as a ring of twelve RGB LEDs, or a dot (e.g., a circle) with six RGB LEDs. Of course, a different number of LEDs is possible. An LED driver can control the color and the intensity of light emitted by each RGB LED. Depending on the number of RGB LED, one or more LED drivers may be used.

The microphone 210 can have an operational state that varies between a sensing state and a mute state. In the sensing state, the microphone 210 detects audio, including natural language utterances, white noise, background noise such as music, and the like, generates audio data based on the detection, and sends the audio data to the SoC 240. In the mute state, the microphone 210 does not detect any audio and no audio data is sent to the SoC 240. Similarly, the camera 215 can have an operational state that varies between a sensing state and a mute state. In the sensing state, the camera 215 detects video and sends the resulting video data to the SoC 240. In the mute state, the camera 215 does not detect any video and no video data is sent to the SoC 240.

In an example, the operational states of the microphone 210 and the camera 215 can be synchronized. In other words, while the microphone 210 is in the sensing state, the camera 215 is also in the sensing state, and vice versa. While the microphone 210 is in the mute state, the camera 215 is also in the mute state, and vice versa. This synchronization can be implemented by using a single mute button to toggle between the states. In particular, upon an activation of the mute button (e.g., illustrated in FIG. 2 as a button activation 250), the microphone 210 and the camera 215 transition to the respective mute states. Upon deactivation of the mute button, the microphone 210 and the camera 215 transition to the respective sensing states. The synchronization of the operational states of the microphone 210 and the camera 215 can be referred to herein by a sensing state and a mute state of the computing device 200. In particular, in the sensing state of the computing device 200, the microphone 210 is in its sensing state and the camera 215 is in its sensing state. In the mute state of the computing device, the microphone 210 is in its mute state and the camera 215 is in its mute state.

In the illustration of FIG. 2, the computing device 200 has two sensors. In this case, the sensing state of the computing device 200 is the same as the sensing state of the microphone 210 and the camera 215, where both sensors can be enabled at the same time or disabled at the same in response to an activation of the mute button 220. In other words, if the sensing state of the computing device 200 is enabled (referred to herein as enabled sensing state), each of the two sensors is also enabled (e.g., the microphone 210 and the camera 215 are each unmuted). Conversely, if the sensing state of the computing device 200 is disabled (referred to herein as disabled sensing state), each of the two sensors is also disabled (e.g., the microphone 210 and the camera 215 are each muted). Of course, other configurations are possible, where multiple buttons can be used to individually enable and disable a sensor or a single button can be used and have different states, where each of the button states can disable or enable one or more of the sensors. In such a case, a sensing state of a computing device corresponds to a sensing state of a sensor(s) rather than all of its sensors depending on how the button configuration is implemented.

The mute button 220 can be implemented similarly to the mute button 120 described in connection with FIG. 1, where the mute button 220 can be a physical button (e.g., a toggle button, a push button, or a sliding button), or a software button (e.g., a non-reprogrammable application that presents a toggle button, a push button, or a sliding button on a GUI).

While the computing device 200 is in the disabled sensing state, embodiments of the present disclosure prevent the audio detection and audio data transmission by powering off the microphone 210 and blanking the output of the microphone 210 to the SoC 240. Blanking includes zeroing the audio data (e.g., setting all data bits to have a zero value in case of digital audio data, setting the voltage level to zero volts of audio data in case of analog audio data). Similarly, while the computing device 200 is in the disabled sensing state, the embodiments of the present disclosure prevent the video detection and video data transmission by powering off the camera 215 and blanking the output of the camera 215 to the SoC 240. This blanking includes, for instance, sending a camera disable signal (e.g., a camera disabled status) to the SoC 240 to disable the video processing at the SoC 240. Alternatively or additionally, blanking the output of the camera 215 includes zeroing the video data on each data line between the camera 215 and the SoC 240.

As illustrated in FIG. 2, prior to a button activation 250, the computing device 200 is in the enabled sensing state, whereby the microphone 210 and the camera 215 are enabled. In the enabled sensing state, the microphone 210 is coupled with the power source 240 over the first power line and, thus, is powered on as illustrated with the solid line between the microphone 210 and the power source 240. Also in the enabled sensing state, the microphone 210 is coupled with the SoC 240 over the first data line and, thus, outputs audio data to the SoC 240, as illustrated with the solid line between the microphone 210 and the SoC 240. Similarly, in the enabled sensing state, the camera 215 is coupled with the power source 240 over the second power line and, thus, is powered on as illustrated with the solid line between the camera 215 and the power source 240. Also in the enabled sensing state, the camera 215 is coupled with the SoC 240 over the second data line and, thus, outputs video data to the SoC 240, as illustrated with the solid line between the camera 215 the SoC 240. The light source 250 does not emit light (e.g., red light) that indicates the disabled sensing state. Instead here, the SoC 240 can control the light emission (e.g., by emitting a blue light to indicate that detection of a wakeword and the reception of speech input). Nonetheless, and as further described in the next figures, the SoC 240 may not cause a light emission that resembles the mute light emission (e.g., a red light) that indicates the disabled sensing state.

Upon the button activation 250, the computing device 200 is in the disabled sensing state, whereby the microphone 210 and the camera 215 are disabled. In the disabled sensing state, the microphone 210 is decoupled from the power source 240 as illustrated with the dotted line between the microphone 210 and the power source 240 (e.g., an open is created in the first power line). Also in the disabled sensing state, the output of the microphone 210 to the SoC 240 is blanked, as illustrated with the dotted line between the microphone 210 and the SoC 240. Similarly, in the disabled sensing state, the camera 215 is decoupled from the power source 240 as illustrated with the dotted line between the camera 215 and the power source 240 (e.g., an open is created in the second power line). Also in the disabled sensing state, the output of the camera 215 to the SoC 240 is blanked, as illustrated with the dotted line between the camera 215 and the SoC 240. Here, the light source 250 emits light (e.g., red light) that indicates the disabled sensing state (shown as mute light emission 252 in FIG. 1). The SoC 240 may not change the mute light emission and may be prevented from changing the disabled sensing state. To unmute the microphone 210 and the camera 215 (e.g., re-enter the enabled sensing state), the mute button 220 can be activated again.

Although FIG. 2 illustrates the computing device 200 as including a single SoC 240 and a single power source 240, other configurations of the computing device 200 are possible. For instance, the computing device 200 can include more than one SoC, each coupled to one of the microphone 210 or the camera 215, and/or more than one power source, each coupled to one of the microphone 210 or the camera 215.

Furthermore, although FIG. 1 illustrates a computing device that includes a single sensor, and although FIG. 2 illustrates a computing device that includes two sensors, it is possible to include a larger number of sensors (e.g., more than two) in a computing device. Nonetheless, and as further illustrated in the next figures, a single controller may suffice to support any number of sensors. This controller can be thought of as a universal controller capable of supporting one or more sensors and one or more different types of sensors. To account for the variability in the number and/or type of sensors, one or more, as applicable, gating peripherals can be included in the computing device, where the gating peripheral(s) is (are) coupled with the controller, the sensor(s), and the SoC(s).

Figure 3:
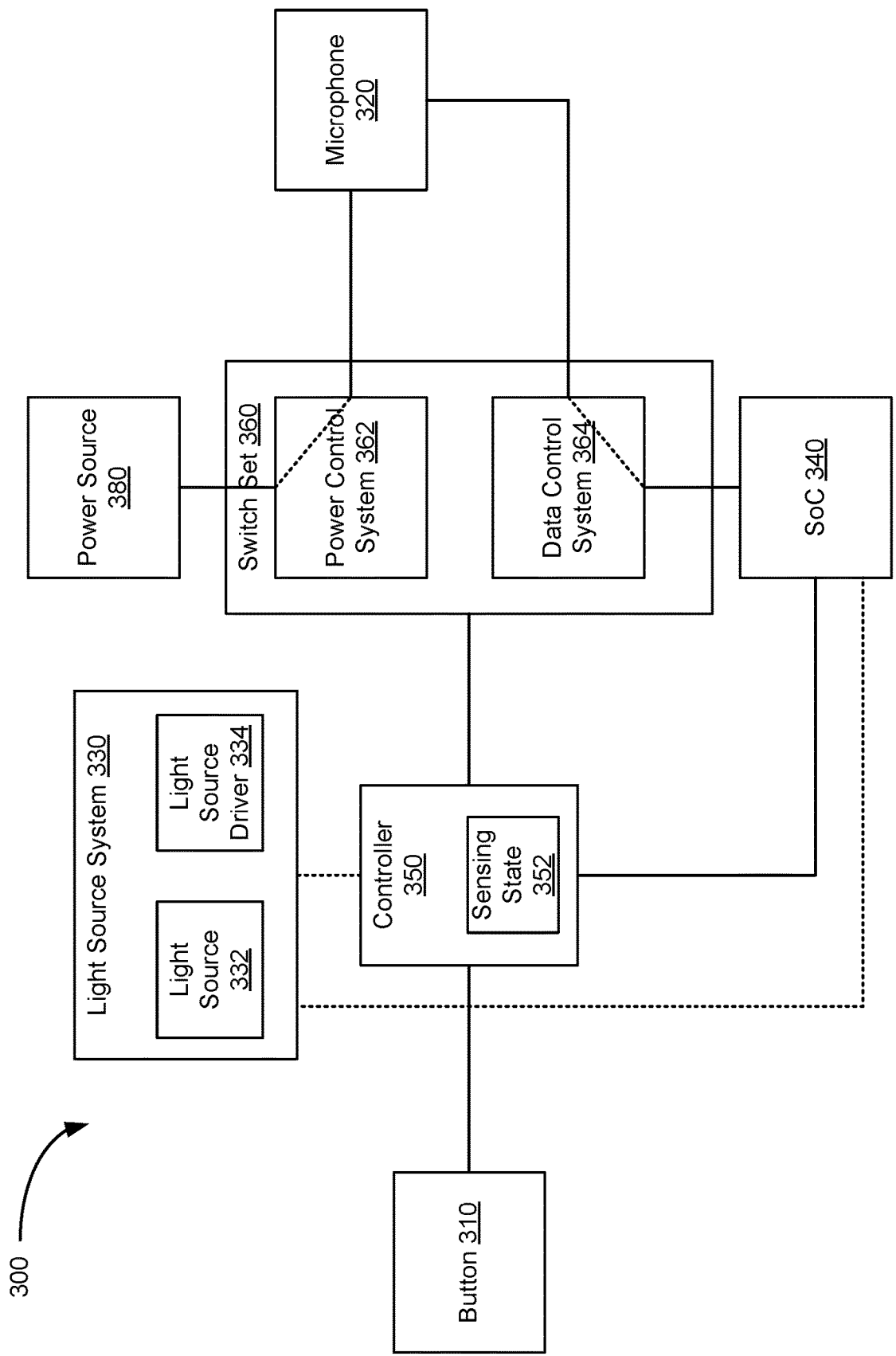
FIG. 3 illustrates an example of a diagram of a computing device that includes a sensor and that controls a sensing state, according to embodiments of the present disclosure.

FIG. 3 illustrates an example of a diagram of a computing device 300 that includes a sensor and that controls a sensing state, according to embodiments of the present disclosure. In this illustrative example, the sensor is a microphone 320 (although other types of the sensor are equivalently possible) and the computing device 300 is an example of the computing device 100 of FIG. 1.

As illustrated, the computing device 300 includes a button 310, the microphone 320, a light source system 330, an SoC 340, a controller 350, a switch set 360, and a power source 380. The light source system 330 includes a light source 332 and, depending on the implementation of the light source 332, one or more light source drivers 334. The controller 350 maintains, among other things, a sensing state 352 that indicates whether the microphone 310 is enabled (e.g., enabled sensing state) or disabled (e.g., disabled sensing state). The sensing state 352 can be stored as sensing state data in a memory of the controller 350. The sensing state data is used for controlling the sensing state of the microphone and light emission by the light source 332 depending on input data from the button 310, the SoC 340, and the light source 332.

In an example, the controller 350 is implemented in an interposer configuration. In the interposer configuration, the controller 350 is coupled with the SoC 340 and bi-directionally with the light source system 330. The controller 350 can arbitrate and control light emissions by the light source 332. In particular, light emission requests (e.g., to emit a particular light) of the SoC 340 are received by the controller 350, processed based on the sensing state 352 and other light-related data, and sent from the controller 350 to the light source system 330. Similarly, upon a determination of the disabled sensing state, the controller 350 can instruct the light source system 330 to emit a particular light to indicate the disabled sensing state. And upon feedback from the light source system 330 of a light emission fault (e.g., mute light emission that indicates the disabled sensing state is occurring while the sensing state 352 indicates the enabled sensing state), the controller 350 can instruct the light source system 330 to emit the light that indicates the disabled sensing state.

In another example, the controller 350 is implemented in a passive sniffer configuration. In the passive sniffer configuration, the controller 350 is coupled with the SoC 340 and in one direction with the light source system 330. The controller can maintain the sensing state 352, indicates it to the SoC 340, and the SoC 340 (also coupled with the light source system 330) instructs the light source system 330 to emit the particular light that indicates the disabled sensing state. Light emission requests of the SoC 340 are sent directly from the SoC 340 to the light source system 330 (e.g., to emit a particular light), are received by the controller 350, processed based on the sensing state and other light-related data, and sent from the controller 350 to the light source system 330. Upon feedback from the light source system 330 of a light emission fault (e.g., mute light emission that indicates the disabled sensing state is occurring while the sensing state 352 indicates the enabled sensing state), the controller 350 can request the SoC 340 to instruct the light source system 330 to emit the light that indicates the disabled sensing state. Differences between the interposer and passive sniffer configurations in terms of couplings of the controller 350 with the SOC 340 and the light source system 330 are illustrated in FIG. 3 with dotted lines.

The button 310 can be a mute button operable to mute (e.g., disable) and unmute (e.g., enable) the microphone 320. The button 310 is coupled with the controller 350 over a data line that carries a mute button signal from the button 310 to the controller 350. Other components can be coupled on this data line including, for instance, a resistor and capacitor (R/C) circuit connected in between the button 310 and the controller 350, where this R/C circuit filters out edges of the mute button signal. The button 310 can be implemented as a switch. When the switch is open, the mute button signal is set to inactive to indicate that the computing device 300 (or, equivalently, the microphone 320) should be in the enabled sensing state. When the switch is closed, the mute button signal is set to active to indicate that the computing device 300 (or, equivalently, the microphone 320) should be in the disabled sensing state instead. Inactive and active can be set by using a low voltage for inactive and a high voltage for active, or vice versa depending on the implementation.

In addition to receiving the mute button as a first input signal, the controller 350 can receive additional input signals. For instance, the controller 350 is coupled with the SoC 340 over a data line and with the light source system 332 over another data line. From the SoC 340, the controller 350 receives an SoC status signal and, in the interposer configuration, an SoC light emission request signal and, optionally, a light source intensity signal. The SoC light request signal and the light source intensity signal may not be received in the passive sniffer configuration. The SoC status signal indicates a status of the SoC 340 including, for instance, where the SoC 340 is booting, the booting is complete, and the like. The SoC light emission request signal can indicate a request for a light emission by the light source 332. The light source intensity signal indicates a setting according to which the light source 332 should emit the light.

From the light source 332, the controller 350 receives a light source voltage feedback signal indicating a voltage level at the light source 332 (e.g., at a cathode of an LED or common cathode of an RGB LED of the light source 332). As further described in the next figures, the controller 350 can determine a failure in the light source 332 based on the voltage level (e.g., a hardware failure causing the light source 332 to emit visible light when no such light emission should be occurring) and can force, as applicable, the transition from the enabled sensing state to the disabled sensing state.

Based on the received input signals, the controller 350 can maintain the sensing state 352, and generate and output multiple output signals. For redundancy and higher fidelity, some of the output signals can be redundant. In addition, for a graceful termination of relevant software execution on the SoC 340, some of the output signals can be delayed relative to other output signals. In an example, the controller 350 is a dedicated microcontroller that implements logic to generate the output signals based on the input signals, where this dedicated hardware can include a microcontroller as further described in connection with FIGS. 11 and 12. In another example, the controller 350 can be implemented as a field-programmable gate array (FPGA), a central processing unit (CPU), an SoC, and/or other circuitry that may execute firmware and/or software, where such circuitry is non-programmable, to prevent any compromise in the SoC 340 from impacting the controls of the controller 350.

In an example, the controller 350 is coupled with the light source system 330, the SoC 340, and the switch set 360 over data lines that carry the output signals. To the light source 332 or a light source driver 334 as applicable, the controller 350 sends a light emission signal and a light source intensity signal in the interposer configuration. In the passive sniffer configuration, the light emission signal can be sent to the SoC 340. In the disabled sensing state, the light emission signal indicates that the light source 332 should emit a particular visible light (e.g., red). In the enabled sensing state, the light emission signal indicates that the light source 332 should stop emitting the particular visible light. When visible light should be emitted, the light source intensity signal indicates a setting for the light emission (e.g., the power level of the light emission), where this setting can correspond to the indication from the SoC and/or can be based on an input signal from an ambient light sensor (ALS) that is coupled with the controller 350.

To the SoC 340, the controller 350 outputs a button activation signal and, optionally, a sensing state status signal. One value of the button activation signal indicates that the button 310 was activated to request the disabled sensing state. Another value of the button activation signal indicates that the button 310 was activated to request the enabled sensing state. The sensing state status signal can indicate whether the sensing state 352 is enabled or disabled or can indicate a change to the sensing state 352, in which case, the sensing state status signal can be an interrupt that the SoC 340 processes to retrieve the current sensing state from the controller 350. When the two signals are used, the controller 350 transmits the sensing state status signal to the SoC 340 following a delay time interval relative to the transmission of the button activation signal, where the delay time interval is large enough to enable the SoC 340 to gracefully terminate the execution of any microphone-related program code. In other words, when the two signals are used, the button activation signal indicates that the button 310 has been selected and the microphone 320 is about to be muted by the end of the delay time interval, and the sensing state status signal indicates to the SoC 340 that the microphone 320 is actually disabled now.

To the switch set 360, the controller 350 outputs a first mute state signal and, optionally, a second mute state signal. The second mute state signal can be redundant to the first mute state signal. For instance, the second mute state signal is an invert of the first mute state signal. By using an invert, logic (e.g., implemented as logic gates) can be included in the switch set 360 to help against improper control of the SoC 340 over the operations of the controller 350 and/or operations of the switch set 360. In addition, the first mute state signal (and, similarly, the second mute state signal) can be delayed by the delay time interval relative to the button activation signal transmitted to the SoC 340. One value of the first mute state signal indicates the enabled sensing state. Another value of the first mute state signal indicates the disabled sensing state.

Upon receiving the indication from the controller 350 that the microphone 320 should be disabled (e.g., by receiving the first mute state signal and, optionally, the second mute state signal with the relevant values), the switch set 360 decouples the microphone 320 from the power source 380 and blanks the data line that couples the microphone 320 to the SoC 340. Conversely, upon receiving the indication from the controller 350 that the microphone 320 should be enabled (e.g., by receiving the first mute state signal and, optionally, the second mute state signal with the relevant values), the switch set 360 couples the microphone 320 to the power source 380 and no longer blanks the data line that couples the microphone 320 to the SoC 340.

In an example, the switch set 360 includes a power control system 362 and a data control system 364. The power control system 362 receives the first mute state signal. When the first mute state signal indicates that the microphone 320 should be disabled, the power control system 362 severs a connection between the power source 380 and the microphone 320, such as by creating an open circuit (e.g., opens a switch) on the power line that couples the power source 380 and the microphone 320, thereby powering off the microphone 320. Conversely, when the first mute state signal indicates that the microphone 320 should be enabled, the power control system 362 closes the circuit (e.g., closes the switch) on the power line that couples the power source 380 and the microphone 320, thereby powering on the microphone 320. The power control system 362 can include any of a power switch or a power regulator.

When only the first mute state signal is transmitted by the controller 350, the data control system 364 receives the first mute state signal. When redundancy is used, where the second mute state signal is also transmitted by the controller 350, the data control system 364 receives the second mute state signal instead. In both cases, when the disabled sensing state is indicated, the data control system 364 zeros the voltage level on the data line. When the enabled sensing state is indicated, no zeroing is performed, thereby the actual audio data sent by the microphone 320 is carried over the data line to the SoC 340. The data control system 364 can include any of a data switch or a set of logic gates.

As illustrated in FIG. 3, the controller 350 is implemented and operated separately from the SoC 340 to increase the security of the muting of the microphone 320. Such an implementation can also involve implementing the switch set 360 separately from the SoC 340. The switch set 360 can be implemented in the controller 350. However, the switch set 360 can be implemented separately from the controller 350, so that the controller 350 can be designed as a universal controller that can be coupled with multiple switch sets, each corresponding to one or more sensors, as further described in FIG. 4. In this way, each switch set can be implemented as a gating peripheral.

Figure 4:
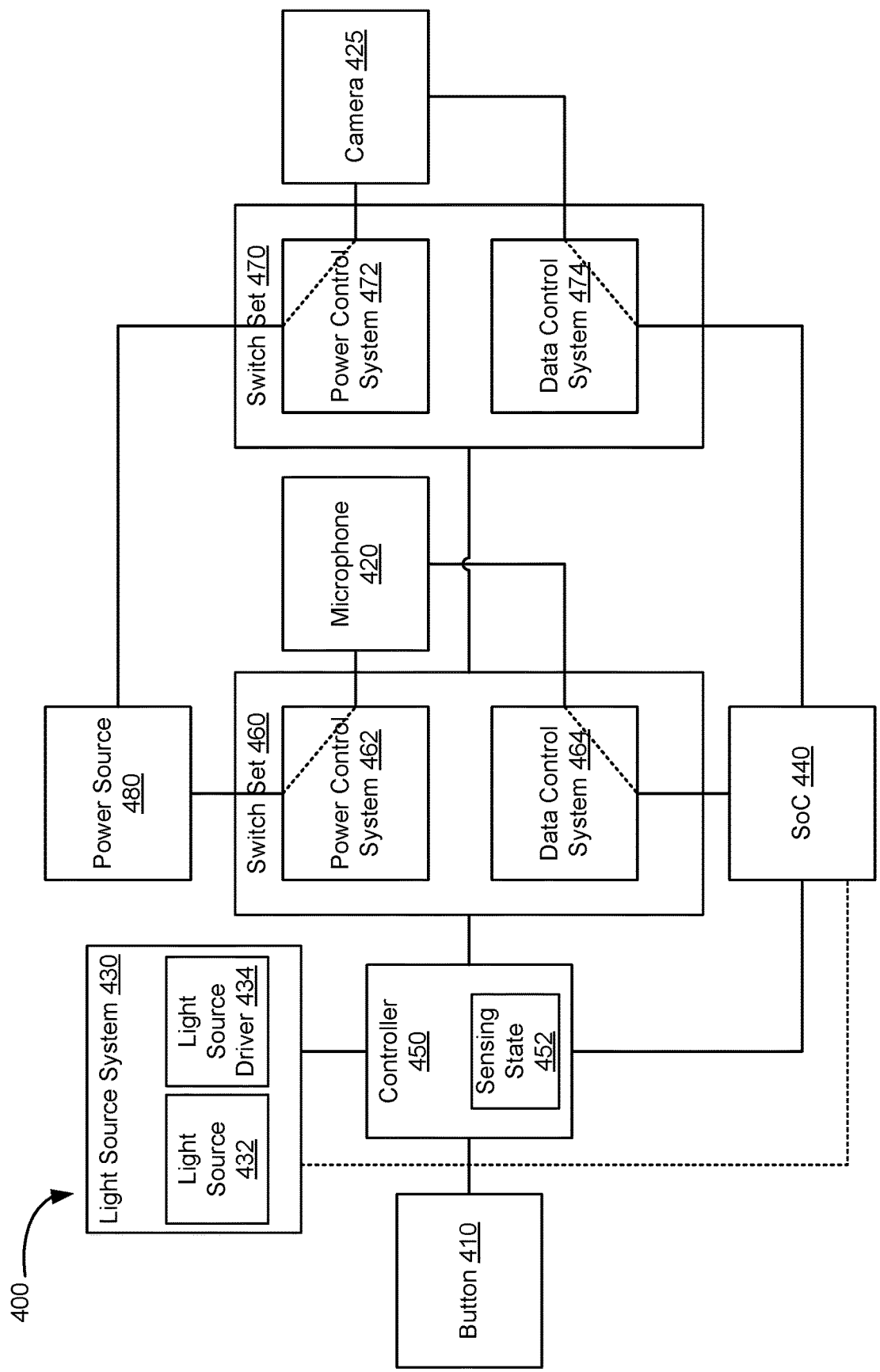
FIG. 4 illustrates an example of a diagram of a computing device that includes multiple sensors and that controls a sensing state, according to embodiments of the present disclosure.

FIG. 4 illustrates an example of a diagram of a computing device 400 that includes multiple sensors and that controls a sensing state, according to embodiments of the present disclosure. In this illustrative example, the computing device 400 include two sensors: a microphone 420 and a camera 425, although other types and/or a larger number of sensors are equivalently possible. The computing device 400 is an example of the computing device 200 of FIG. 2. A sensing state of the computing device 400 corresponds to both the microphone 420 and the camera 425 being in the same sensing state. A disabled sensing state of the computing device 400 corresponds to both the microphone 420 and the camera 425 being disabled. An enabled sensing state of the computing device 400 corresponds to both the microphone 420 and the camera 425 being enabled.

As illustrated, the computing device 400 includes a button 410, the microphone 420, the camera 425, a light source system 430, a SoC 440, a controller 450, a switch set 460, a switch set 470, and a power source 480. Each of the button 410, the microphone 420, the light source 432, the SoC 440, the controller 450, and the switch set 460 can be the same as the button 310, the microphone 320, the light source system 330, the SoC 340, the controller 350, and the switch set 360, respectively, of FIG. 3. The switch set 470 is implemented to couple the controller 450 to the camera 425, thereby extending the controls of the controller 450 to not only cover the microphone 420, but to also cover the camera 425.

The light source system 430 includes a light source 432 and, depending on the implementation of the light source 432, one or more light source drivers 434. The controller 450 maintains, among other things, a sensing state 452 that indicates whether the microphone 410 is enabled (e.g., enabled sensing state) or disabled (e.g., disabled sensing state). The sensing state 452 can be stored as sensing state data in a memory of the controller 450. The sensing state data is used for controlling the sensing state of the microphone and light emission by the light source 432 depending on input data from the button 410, the SoC 440, and the light source 432. Here also, the controller 450 can be implemented in an interposer configuration or a passive sniffer configuration.

In an example, the button 410 is a mute button operable to mute (e.g., disable) and unmute (e.g., enable) the microphone 420 and the camera 425. The button 410 is coupled with the controller 450 over a data line that carries a mute button signal from the button 410 to the controller 450. Other components can be coupled on this data line including, for instance, a resistor and capacitor (R/C) circuit connected in between the button 410 and the controller 450, where this R/C circuit filters out edges of the mute button signal. The button 410 can be implemented as a switch. When the switch is open, the mute button signal is set to inactive to indicate that the computing device 400 (or, equivalently, the microphone 420 and the camera 425) should be in the enabled sensing state. When the switch is closed, the mute button signal is set to active to indicate that the computing device 400 (or, equivalently, the microphone 420 and the camera 425) should be in the disabled sensing state instead. Inactive and active can be set by using a low voltage for inactive and a high voltage for active, or vice versa depending on the implementation.

In addition to receiving the mute button as a first input signal, the controller 450 can receive additional input signals. For instance, the controller 450 is coupled with the SoC 440 over a data line and with the light source system 432 over another data line. From the SoC 440, the controller 450 receives an SoC status signal and, in the interposer configuration, an SoC light emission request signal and, optionally, a light source intensity signal. The SoC light request signal and the light source intensity signal may not be received in the passive sniffer configuration. The SoC status signal indicates a status of the SoC 440 including, for instance, where the SoC 440 is booting, the booting is complete, and the like. The SoC light emission request signal can indicate a request for a light emission by the light source 432. The light source intensity signal indicates a setting according to which the light source 432 should emit the light.

From the light source 432, the controller 450 receives a light source voltage feedback signal indicating a voltage level at the light source 432 (e.g., at a cathode of an LED or a common cathode of an RGB LED of the light source 432). As further described in the next figures, the controller 450 can determine a failure in the light source 432 based on the voltage level (e.g., a hardware failure causing the light source 432 to emit visible light when no such mute light emission should be occurring) and can force, as applicable, the transition from the enabled sensing state to the disabled sensing state.

Based on the received input signals, the controller 450 can maintain the sensing state 452, and generate and output multiple output signals. For redundancy and higher fidelity, some of the output signals can be redundant. In addition, for a graceful termination of relevant software execution on the SoC 440, some of the output signals can be delayed relative to other output signals. In an example, the controller 450 is dedicated microcontroller that implements logic to generate the output signals based on the input signals, where this dedicated hardware can include a microcontroller as further described in connection with FIGS. 11 and 12. In another example, the controller 450 can be implemented as a field-programmable gate array (FPGA), a central processing unit (CPU), an SoC, and/or other circuitry that may execute firmware and/or software, where such circuitry is non-programmable, to prevent any compromise in the SoC 440 from impacting the controls of the controller 450.

In an example, the controller 450 is coupled with the light source system 430, the SoC 440, the switch set 460, and the switch set 470 over data lines that carry the output signals. To the light source 432 or a light source driver 434 as applicable, the controller 450 sends a light emission signal and a light source intensity signal in the interposer configuration. In the passive sniffer configuration, the light emission signal can be sent to the SoC 440. In the disabled sensing state, the light emission signal indicates that the light source 432 should emit a particular visible light (e.g., red). In the enabled sensing state, the light emission signal indicates that the light source 432 should stop emitting the particular visible light. When visible light should be emitted, the light source intensity signal indicates a setting for the light emission (e.g., the power level of the light emission), where this setting can correspond to the indication from the SoC and/or can be based on an input signal from an ambient light sensor (ALS) that is coupled with the controller 450.

To the SoC 440, the controller 450 outputs a button activation signal and, optionally, a sensing state status signal. One value of the button activation signal indicates that the button 410 was activated to request the disabled sensing state. Another value of the button activation signal indicates that the button 410 was activated to request the enabled sensing state. The sensing state status signal can indicate whether the sensing state 452 is enabled or disabled or can indicate a change to the sensing state 452, in which case, the sensing state status signal can be an interrupt that the SoC 440 processes to retrieve the current sensing state from the controller 450. When the two signals are used, the controller 450 transmits the sensing state status signal to the SoC 440 following a delay time interval relative to the transmission of the button activation signal, where the delay time interval is large enough to enable the SoC 440 to gracefully terminate the execution of any microphone-related program code and any camera-related program code. In other words, when the two signals are used, the button activation signal indicates that the button 410 has been selected and the microphone 420 is about to be muted by the end of the delay time interval, and the sensing state status signal indicates to the SoC 440 that the microphone 420 and the camera 425 are actually disabled now.

To the switch set 460, the controller 450 outputs a first mute state signal and, optionally, a second mute state signal. The second mute state signal can be redundant to the first mute state signal. For instance, the second mute state signal is an invert of the first mute state signal. By using an invert, logic (e.g., implemented as logic gates) can be included in the switch set 460 to help against controls of the SoC 440 over the operations of the controller 450 and/or operations of the switch set 460. In addition, the first mute state signal (and, similarly, the second mute state signal) can be delayed by the delay time interval relative to the button activation signal transmitted to the SoC 440. One value of the first mute state signal indicates the enabled sensing state. Another value of the first mute state signal indicates the disabled sensing state.

Upon receiving the indication from the controller 450 that the microphone 420 should be disabled (e.g., by receiving the first mute state signal and, optionally, the second mute state signal with the relevant values), the switch set 460 decouples the microphone 420 from the power source 480 and blanks the data line that couples the microphone 420 to the SoC 440. Conversely, upon receiving the indication from the controller 450 that the microphone 420 should be enabled (e.g., by receiving the first mute state signal and, optionally, the second mute state signal with the relevant values), the switch set 460 couples the microphone 420 to the power source 480 and no longer blanks the data line that couples the microphone 420 to the SoC 440.

In an example, the switch set 460 includes a power control system 462 and a data control system 464. The power control system 462 receives the first mute state signal. When the first mute state signal indicates that the microphone 420 should be disabled, the power control system 462 severs a connection between the power source 480 and the microphone 420, such as by creating an open circuit (e.g., opens a switch) on the power line that couples the power source 480 and the microphone 420, thereby powering off the microphone 420. Conversely, when the first mute state signal indicates that the microphone 420 should be enabled, the power control system 462 closes the circuit (e.g., closes the switch) on the power line that couples the power source 480 and the microphone 420, thereby powering on the microphone 420. The power control system 462 can include any of a power switch or a power regulator.

When only the first mute state signal is transmitted by the controller 450, the data control system 464 receives the first mute state signal. When redundancy is used, where the second mute state signal is also transmitted by the controller 450, the data control system 464 receives the second mute state signal instead. In both cases, when the disabled sensing state is indicated, the data control system 464 zeros the voltage level on the data line. When the enabled sensing state is indicated, no zeroing is performed, thereby the actual audio data sent by the microphone 420 is carried over the data line to the SoC 440. The data control system 464 can include any of a data switch or a set of logic gates.

To the switch set 470, the controller 450 also outputs the first mute state signal and, optionally, the second mute state signal. For instance, the one or more data lines that couple the controller 450 with the switch set 460 also couple the controller with the other switch set 470.

Upon receiving the indication from the controller 450 that the camera 425 should be disabled (e.g., by receiving the first mute state signal and, optionally, the second mute state signal with the relevant values), the switch set 470 decouples the camera 425 from the power source 480 and blanks the data line that couples the camera 425 to the SoC 440. Conversely, upon receiving the indication from the controller 450 that the camera 425 should be enabled (e.g., by receiving the first mute state signal and, optionally, the second mute state signal with the relevant values), the switch set 470 couples the camera 425 to the power source 480 and no longer blanks the data line that couples the camera 425 to the SoC 440.

In an example, the switch set 470 includes a power control system 472 and a data switch 474. The power control system 472 receives the first mute state signal. When the first mute state signal indicates that the camera 425 should be disabled, the power control system 472 severs a connection between the power source 480 and the camera 425, such as by creating an open circuit (e.g., opens a switch) on the power line that couples the power source 480 and the camera 425, thereby powering off the camera 425. Conversely, when the first mute state signal indicates that the camera 425 should be enabled, the power control system 472 closes the circuit (e.g., closes the switch) on the power line that couples the power source 480 and the camera 425, thereby powering on the camera 425. Each of one of the power control systems 462 and 472 can include any of a power switch or a power regulator.

When only the first mute state signal is transmitted by the controller 450, the data control system 474 receives the first mute state signal. When redundancy is used, where the second mute state signal is also transmitted by the controller 450, the data control system 474 receives the second mute state signal instead. In both cases, when the disabled sensing state is indicated, the data control switch 474 sets an override signal on the data line between the camera 425 and the SoC 440. Different types of overrides are possible. In one example, the override signal indicates that the camera is disabled (e.g., the override signal is a camera disable signal). In another example, the override signal can zero any video data that would have been otherwise transmitted from the camera 425 to the SoC 440 (in which case, the data line can include multiple data lines, each carrying a subset of the video data). When the enabled sensing state is indicated, no override signal is used, thereby the actual video data sent by the camera 425 is carried over the data line to the SoC 440. The data control system 474 can include any of a data switch or a set of logic gates.

As illustrated in FIGS. 3 and 4, the controller 450 can be implemented as a universal controller. Controls by the universal controller can extended to multiple sensors by coupling the universal controller to multiple switch sets, each implemented as a gating peripheral and coupled to a corresponding sensor. The first mute state signal and, optionally, the second mute state signal are transmitted from the universal controller to each of the switch sets to control operations of these switch sets.

Figure 5:
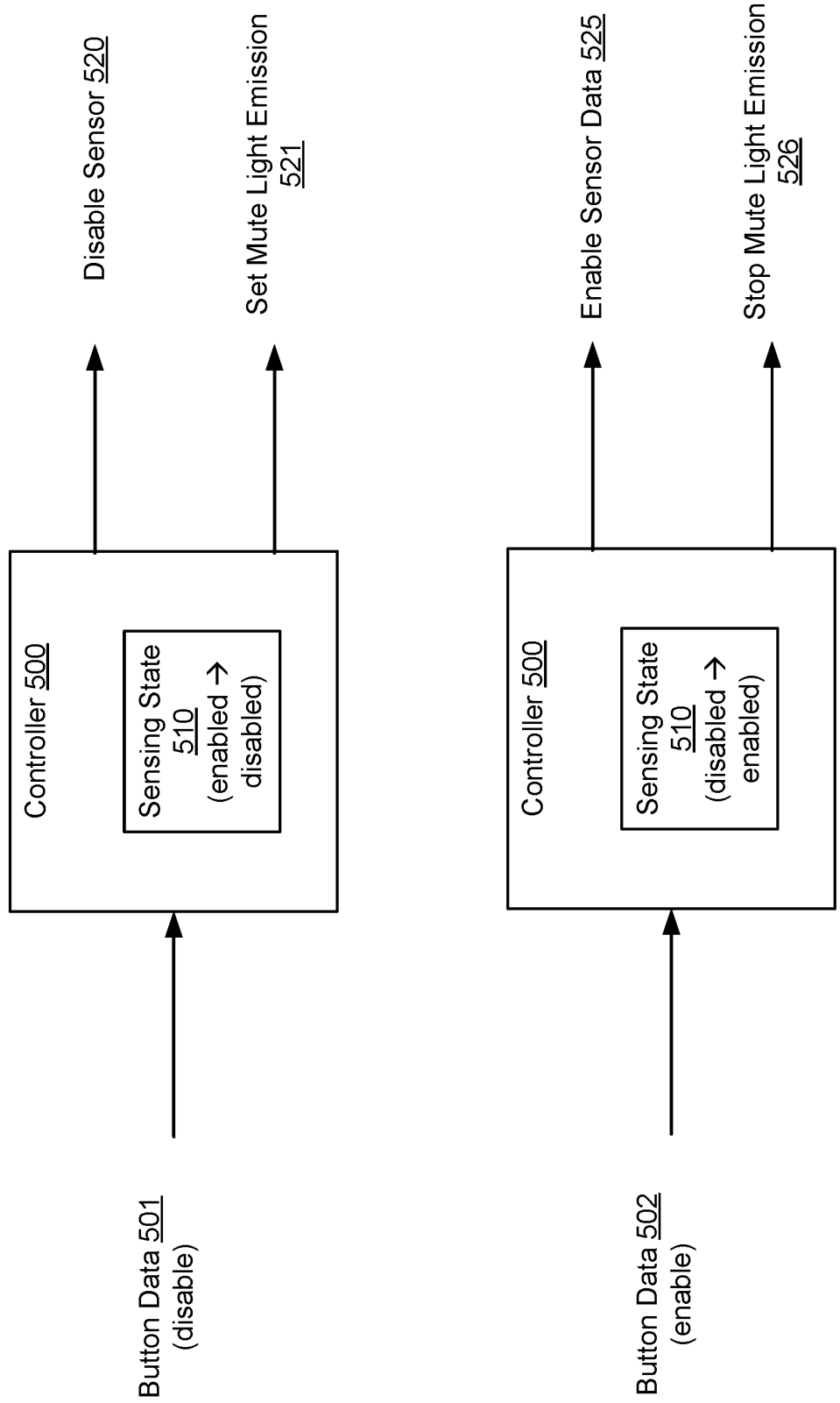
FIG. 5 illustrates an example of a diagram of a controller that controls a sensing state of a computing device based on button activations, according to embodiments of the present disclosure.

FIG. 5 illustrates an example of a diagram of a controller 500 that controls a sensing state of a computing device based on button activations, according to embodiments of the present disclosure. The controller 500 is an example of the controller 350 of FIG. 3 or the controller 450 of FIG. 4. The controller 500 maintains a sensing state 510 of the computing device. For instance, sensing state data is stored in a memory of the controller 500. and indicates whether the sensing state 510 is currently enabled or disabled. Based on activation of a button of the computing device and on the sensing state data, the controller 500 disables or enables a sensor (or, similarly, multiple sensors) of the computing device, causes the relevant indication of the sensing state 510, and updates the sensing state data. In an example, the indication includes emitting a particular light (e.g., mute light emission such as red light emission) to indicate the disabled sensing state and stopping the light emission otherwise. Other indications are similarly possible.

As illustrated in the top part of FIG. 5, the sensing state 510 indicates that the sensor is enabled. Button data 501 is received by the controller 500 upon an activation of the button. The button data 501 indicates a request to the disable the sensor (e.g., mute a microphone). The controller 500 determines, from the sensing state data in the memory, that the sensing state 510 is enabled. Accordingly, the controller 500 outputs data to disable 520 the sensor and to set 521 the mute light emission. Referring back to FIGS. 3 and 4, the data to disable 520 the sensor can be referred to as disable data and can be sent in a first mute state signal and, optionally, a second mute state signal to a switch set that controls the power supply to the sensor and the data transmission from the sensor. The data to set 521 the mute light emission can be referred to as light data (or LED data when LEDs are used) and can be sent as an instruction or a command to a light source system (e.g., to an LED driver) in an interposer configuration or to an SoC in a passive sniffer configuration. In both configurations, the light data can be sent over an I2C bus and can include for instance, an RGB value, or a current and pulse width modulation (PWM) percentages to control the light emission. Further, the controller 500 updates the sensing state 510 by storing updated sensing data in the memory, where the updated sensing data indicates that the sensor is disabled (e.g., indicates that the sensing state 510 is now disabled).

As illustrated in the bottom part of FIG. 5, the sensing state 510 is disabled. Button data 502 is received by the controller 500 upon an activation of the button. The button data 502 indicates a request to the enable the sensor (e.g., unmute the microphone). The controller 500 determines, from the sensing state data in the memory, that the sensing state 510 is disabled. Accordingly, the controller 500 outputs data to enable 525 the sensor and to stop 526 the mute light emission. Referring back to FIGS. 3 and 4, the data to enable 525 the sensor can be referred to as enable data and can be sent in the first mute state signal and, optionally, the second mute state signal to the switch set. The light data to stop 525 the mute light emission can be sent as an instruction or a command to the light source system (e.g., to the LED driver) in the interposer configuration or to the SoC in the passive sniffer configuration. Further, the controller 500 updates the sensing state 510 by storing updated sensing data in the memory, where the updated sensing data indicates that the sensor is enabled (e.g., indicates that the sensing state 510 is now enabled).

Figure 6:
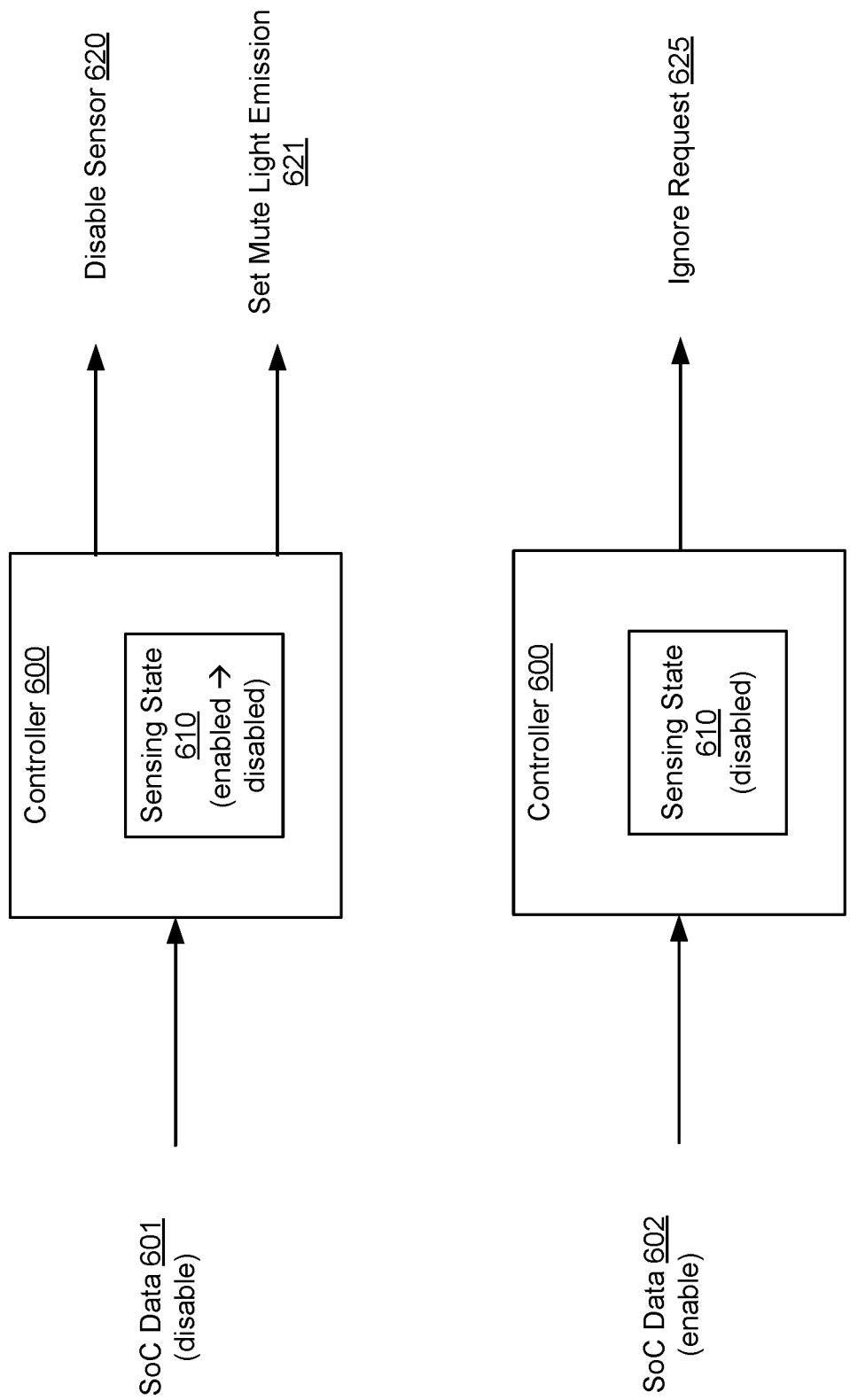
FIG. 6 illustrates an example of a diagram of a controller that controls a sensing state of a computing device based on system on a chip (SoC) requests, according to embodiments of the present disclosure.

FIG. 6 illustrates an example of a diagram of a controller 600 that controls a sensing state of a computing device based on system on a SoC requests, according to embodiments of the present disclosure. The controller 600 is an example of the controller 350 of FIG. 3 or the controller 450 of FIG. 4. The controller 600 maintains a sensing state 610 of the computing device, similar to the sensing state 510 of FIG. 5. An SoC of the computing device may disable a sensor (or, similarly, multiple sensors) and the controller 600 can provide the relevant controls for the disabling. However, the SoC may not re-enable the sensor. Instead, and as further described in FIG. 7, a button activation may be needed.

As illustrated in the top part of FIG. 6, the sensing state 610 indicates that the sensor is enabled. SoC data 601 is received by the controller 600 and indicates a request of the SoC to disable a sensor (e.g., mute a microphone). This request can be made based on execution of program code on the SoC, where the program code can generate an instruction for the disabling. The controller 600 determines, from the sensing state data in the memory, that the sensing state 610 is enabled. Accordingly, the controller 600 outputs data to disable 620 the sensor and to set 621 the mute light emission. Further, the controller 600 updates the sensing state 610 by storing updated sensing data in the memory, where the updated sensing data indicates that the sensor is disabled (e.g., indicates that the sensing state 610 is now disabled).

As illustrated in the bottom part of FIG. 6, the sensing state 610 is disabled. SoC data 602 is received by the controller 600 and indicates a request of the SoC to enable the sensor (e.g., unmute the microphone). This request can be made based on execution of the program code or another program code on the SoC, where the executed program code can generate an instruction for the enabling. The controller 600 determines, from the sensing state data in the memory, that the sensing state 610 is disabled. Because the request to re-enable the sensor is from the SoC and is not based on an button activation, the controller 600 ignores 625 the request. Therefore, the sensor remains disabled and the sensing state data is not updated.

Figure 7:
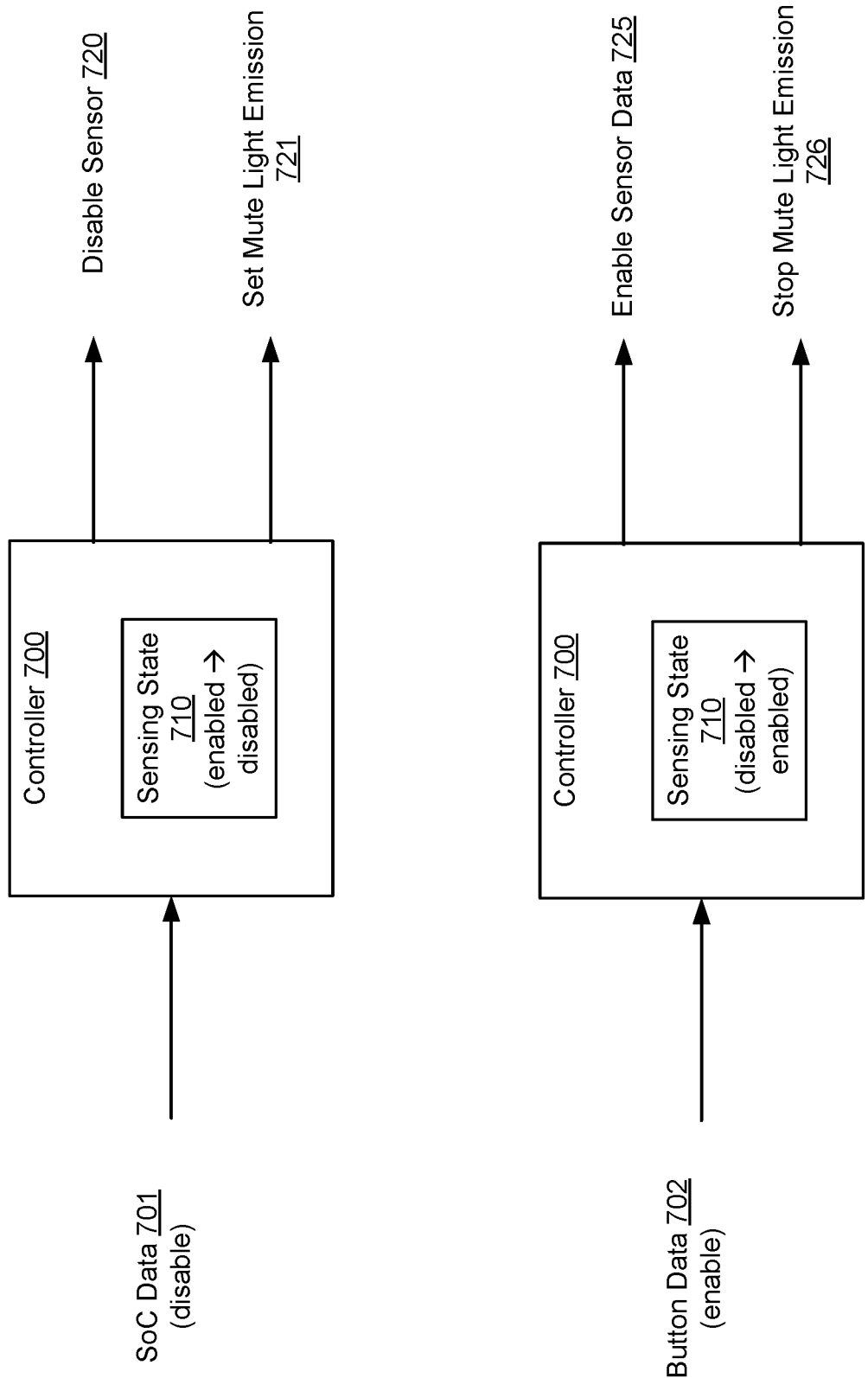
FIG. 7 illustrates an example of a diagram of a controller that controls a sensing state of a computing device based on an SoC request to disable a sensor and button activation to enable the sensor, according to embodiments of the present disclosure.

FIG. 7 illustrates an example of a diagram of a controller 700 that controls a sensing state of a computing device based on an SoC request to disable a sensor and button activation to enable the sensor, according to embodiments of the present disclosure. The controller 700 is an example of the controller 350 of FIG. 3 or the controller 450 of FIG. 4. The controller 700 maintains a sensing state 710 of the computing device, similar to the sensing state 510 of FIG. 5. An SoC of the computing device may disable the sensor (or, similarly, multiple sensors) and the controller 700 can provide the relevant controls for the disabling. A button activation may re-enable the sensor.

As illustrated in the top part of FIG. 7, the sensing state 710 indicates that the sensor is enabled. SoC data 701 is received by the controller 700 and indicates a request of the SoC to disable a sensor (e.g., mute a microphone). The controller 700 determines, from the sensing state data in the memory, that the sensing state 710 is enabled. Accordingly, the controller 700 outputs data to disable 720 the sensor and to set 721 the mute light emission. Further, the controller 700 updates the sensing state 710 by storing updated sensing data in the memory, where the updated sensing data indicates that the sensor is disabled (e.g., indicates that the sensing state 710 is now disabled).

As illustrated in the bottom part of FIG. 7, the sensing state 710 is disabled. Button data 702 is received by the controller 700 upon an activation of a button. The button data 702 indicates a request to the enable the sensor (e.g., unmute the microphone). The controller 700 determines, from the sensing state data in the memory, that the sensing state 710 is disabled. Because the button data is received from the button and because the sensing state is currently disabled, the controller 700 outputs data to enable 725 the sensor and to stop 726 the mute light emission. Further, the controller 700 updates the sensing state 710 by storing updated sensing data in the memory, where the updated sensing data indicates that the sensor is enabled (e.g., indicates that the sensing state 710 is now enabled).

Figure 8:
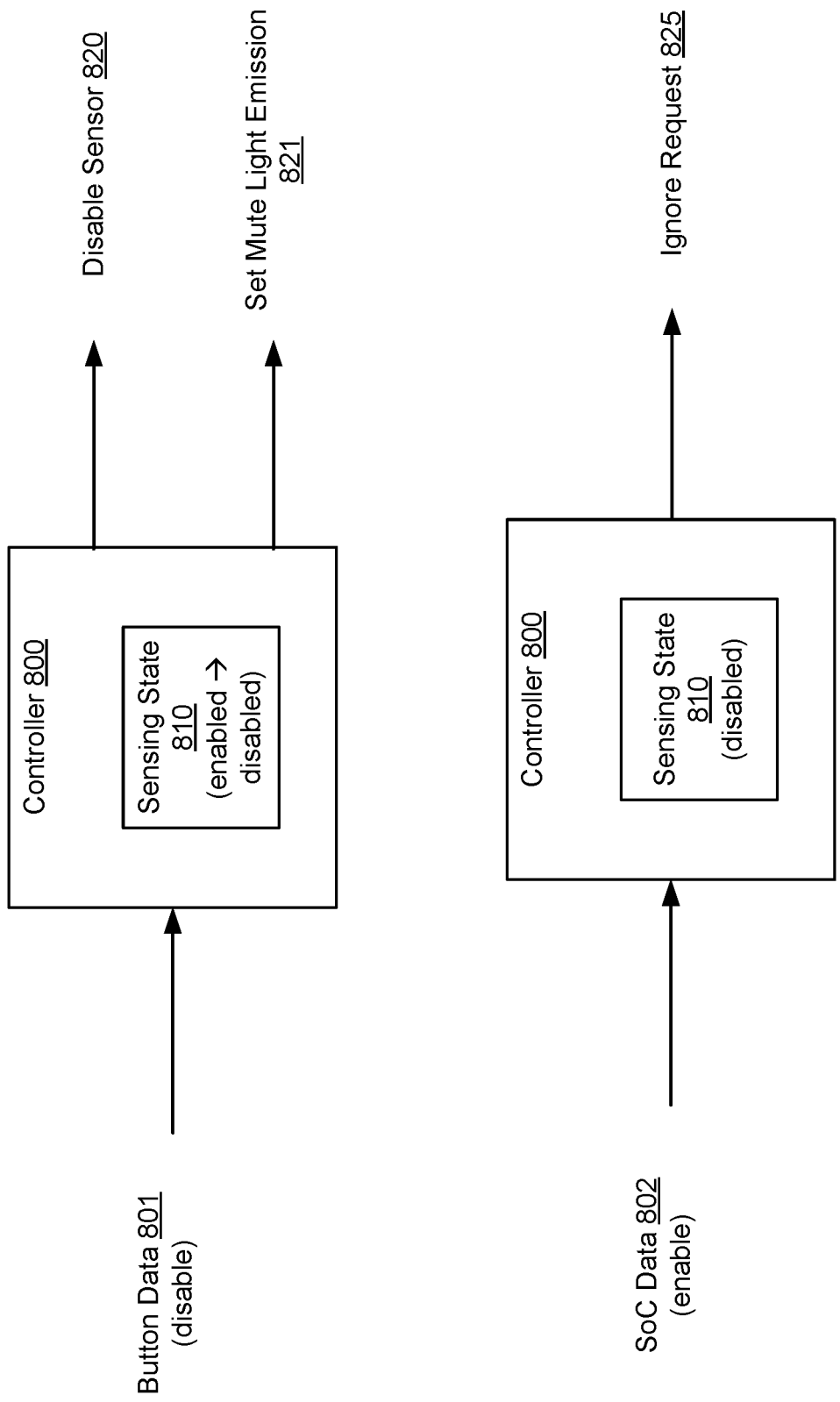
FIG. 8 illustrates an example of a diagram of a controller that controls a sensing state of a computing device based on button activation to disable the sensor and an SoC request to enable the sensor, according to embodiments of the present disclosure.

FIG. 8 illustrates an example of a diagram of a controller 800 that controls a sensing state of a computing device based on button activation to enable a sensor and an SoC request to disable the sensor, according to embodiments of the present disclosure. The controller 800 is an example of the controller 350 of FIG. 3 or the controller 450 of FIG. 4. The controller 800 maintains a sensing state 810 of the computing device, similar to the sensing state 510 of FIG. 5. A button of the computing device may disable the sensor (or, similarly, multiple sensors) and the controller 800 can provide the relevant controls for the disabling. However, an SoC of the computing device may not re-enable the sensor and instead, a button activation may be needed.

As illustrated in the top part of FIG. 8, the sensing state 810 indicates that the sensor is enabled. Button data 801 is received by the controller 800 upon an activation of the button. The button data 801 indicates a request to the disable the sensor (e.g., mute a microphone). The controller 800 determines, from the sensing state data in the memory, that the sensing state 810 is enabled. Accordingly, the controller 800 outputs data to disable 820 the sensor and to set 821 the mute light emission. Further, the controller 800 updates the sensing state 810 by storing updated sensing data in the memory, where the updated sensing data indicates that the sensor is disabled (e.g., indicates that the sensing state 810 is now disabled).

As illustrated in the bottom part of FIG. 8, the sensing state 810 is disabled. SoC data 802 is received by the controller 800 and indicates a request of the SoC to enable the sensor (e.g., unmute the microphone). This request can be made based on execution of program code on the SoC, where the program code can generate an instruction for the enabling. The controller 800 determines, from the sensing state data in the memory, that the sensing state 810 is disabled. Because the request to re-enable the sensor is from the SoC and is not based on an button activation, the controller 800 ignores 825 the request. Therefore, the sensor remains disabled and the sensing state data is not updated.

Figure 9:
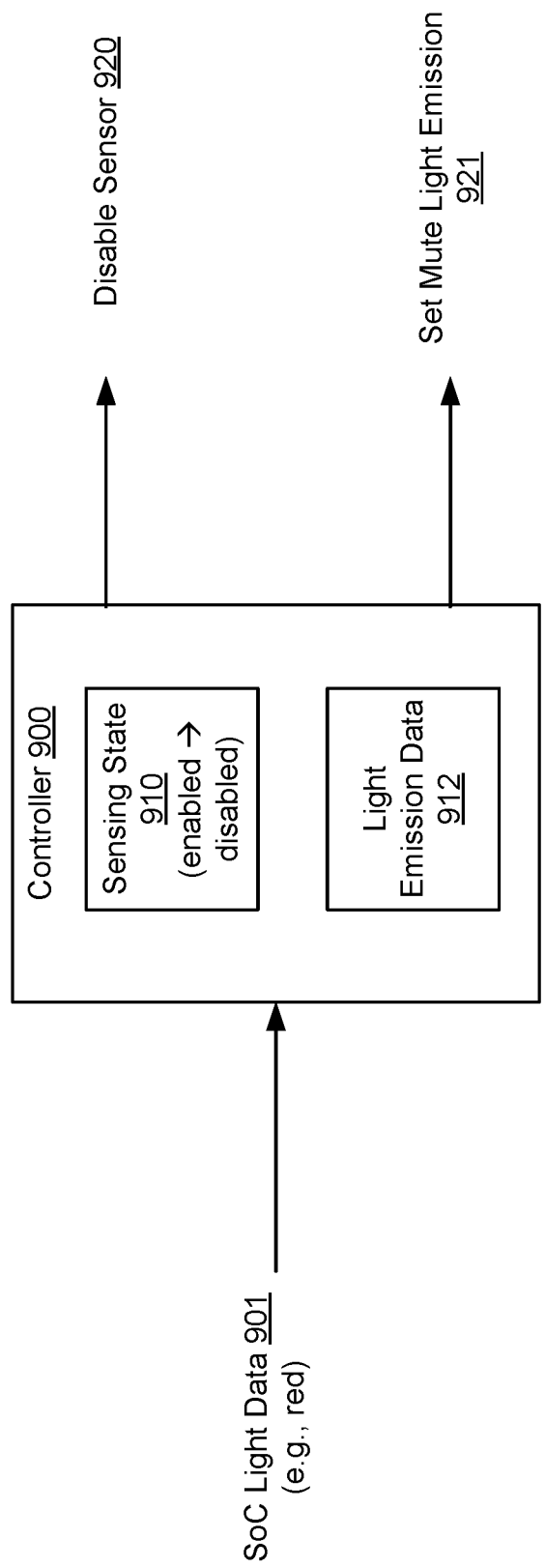
FIG. 9 illustrates an example of a diagram of a controller that controls a sensing state and light emission of a computing device based on an SoC light emission request, according to embodiments of the present disclosure.

FIG. 9 illustrates an example of a diagram of a controller 900 that controls a sensing state and light emission of a computing device based on an SoC light emission request, according to embodiments of the present disclosure. The controller 900 is an example of the controller 350 of FIG. 3 or the controller 450 of FIG. 4. The controller 900 maintains a sensing state 910 of the computing device, similar to the sensing state 510 of FIG. 5. Here, when the sensor is disabled, a particular light emission is used to indicate the disabled sensing state (e.g., red light). If a request for light emission is made by the SoC for any other light color, the controller 900 can ignore this request as long as the sensing state 910 is set to disabled. In the enabled sensing state, the light emission request of the SoC can be further processed, where the controller 900 compares the requested light emission (e.g., the requested light color) with the mute light emission that indicates the disabled sensing state. If the result of the comparison indicates possible user confusion (e.g., the requested light color is the same, such as by being also red, or is similar enough, such as being a cherry color), the controller 900 disables the sensor and emits the requested light or the one used to indicate the disabled sensing state. The similarity comparison between the light emissions can rely on light emission data 912 stored in the memory of the controller 900.

Various types of the light emission data 912 are possible. In an example, the light emission data 912 stores an RGB value range of light colors that are similar to the one used to indicate the disabled mute state. In this case, the data received from the SoC to request a light emission includes an RGB value that is then compared to the RGB value range and, if within this range, the controller 900 transitions to the disabled sensing state. In another example, the light emission data stores a range of current and/or PWM percentages that, when used to emit light, would result in light emissions similar to the one used to indicate the disabled mute state. In this case, the data received from the SoC to request a light emission includes a current value and/or PWM percentages that are then compared to the current and/or PWM percentage range and, if within this range, the controller 900 transitions to the disabled sensing state.

In the illustration of FIG. 9, the light emission used to indicate the disabled sensing state involves red light. The sensing state 910 is enabled. SoC light data 901 is received by the controller 900 from the SoC and indicates a request to emit red light. Based on a comparison of SoC light data 901 with the light emission data 912 and based on the sensing state 910 being currently enabled, the controller 900 disables 920 the sensor and sets 921 the mute light emission. Further, the controller 900 updates the sensing state 910 by storing updated sensing data in the memory, where the updated sensing data indicates that the sensor is disabled (e.g., indicates that the sensing state 910 is now disabled).

Figure 10:
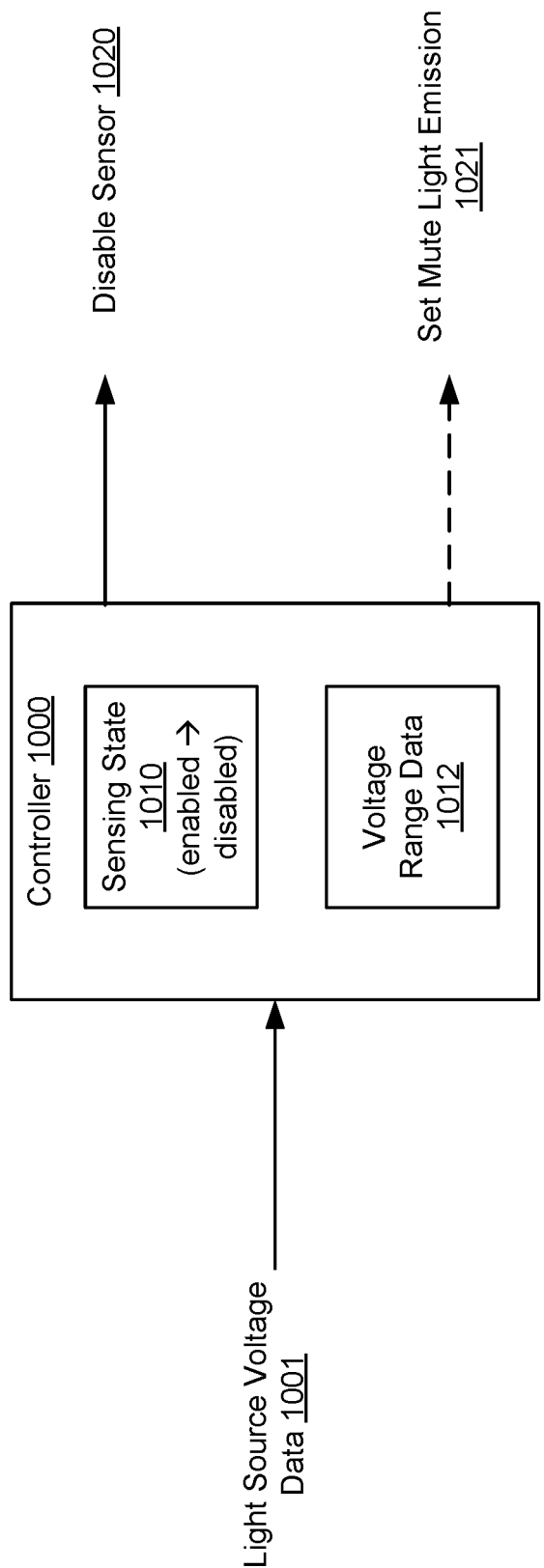
FIG. 10 illustrates an example of a diagram of a controller that controls a sensing state of a computing device based on light source voltage feedback, according to embodiments of the present disclosure.

FIG. 10 illustrates an example of a diagram of a controller 1000 that controls a sensing state of a computing device based on light source voltage feedback, according to embodiments of the present disclosure. The controller 1000 is an example of the controller 350 of FIG. 3 or the controller 450 of FIG. 4. The controller 1000 maintains a sensing state 1010 of the computing device, similar to the sensing state 510 of FIG. 5. Here, when the sensor is disabled, a particular light is emitted by a light source to indicate the disabled sensing state (e.g., mute light emission such as red light emission). If in the enabled sensing state, the light source emits the particular light (e.g., red light) due to a fault at the light source, the controller 1000 disables the sensor until, for instance, the fault is cleared, the computing device is restarted, and/or a particular button activation (e.g., a push and hold for some predefined amount of time) is detected.

In an example, the fault is detected based on voltage measurements at the light source. The controller 1000 can compare one or more measured voltage values to voltage range data 1012. The voltage range data 1012 can be stored in the memory of the controller 1000 and can indicate a range of voltage values associated with a light emission fault of the light source. For instance, if a measured voltage value is within this range, a fault likely exists. Conversely, the voltage range data 1012 can indicate a range of voltage values associated with normal operations of the light source. In this case, if a measured voltage value is outside this range, a fault likely exists and the sensing state needs to be updated to disabled.

Different approaches can be used to measure voltage at the light source. For instance, the light source includes a plurality of LEDs or sets of RGB LEDs. A voltage can be measured per LED at the cathode of the LED. Additionally or alternatively, a voltage can be measured per RGB LED at a common cathode of the red, blue, and green LEDs. Further, the controller 1000 can monitor the voltages in parallel at a particular monitoring rate (e.g., between four-hundred kilohertz and two megahertz). Alternatively, the voltages can be monitored sequentially or in a particular pattern at the particular monitoring rate. The monitoring rate can also be dynamic. For instance, upon detection of a likely fault, the controller 1000 can increase the monitoring rate.

Furthermore, different approaches can be used to determine a fault and transition into the disabled sensing state. In one example, if a minimum number (e.g., one) of the measured voltage values are within the fault voltage range (or, conversely, outside of the normal operational voltage range), the controller 1000 declares a fault and causes the transition. In another example, a certain percentage of the measured values have to indicate the fault (e.g., thirty percent or some other percentage value) for the transition. In yet another example, a time dimension may be added, where if a measured voltage value(s) indicates a likely fault for at least a predefined time duration (e.g., one second), the controller 1000 declares a fault and causes the transition.

In the illustration of FIG. 10, the controller 1000 receives light source voltage data 1001 at the particular monitoring rate, where this data 1001 indicates measured voltage values at the light source. The sensing state 1010 is enabled. The controller 1000 compares the voltage values indicated by the light source voltage data 1001 to the voltage value range defined in the voltage range data 1012. When the comparison indicates a light emission fault, the controller 1000 disables 1020 the sensor and, optionally as indicated with the dashed arrow, sets 1021 the mute light emission (e.g., if one RGB LED was faulty, the light emission is set such that all RGB LED emit the red light). Further, the controller 1000 updates the sensing state 1010 by storing updated sensing data in the memory, where the updated sensing data indicates that the sensor is disabled (e.g., indicates that the sensing state 1010 is now disabled).

The light source voltage data 1001 is an example of light source data fed back from the light source to the controller 1000 and indicating a mode of operation of the light source. Other types of light source data are possible including, for instance, feedback data indicating an electrical current value, an electrical power value, and the like. A vale indicated by the light source data can be compared to an operational range of values. If within the range, the controller 1000 can determine that the light source is operating in a normal mode. If outside the range, the controller 1000 can determine that the light source is operating in a failure mode (e.g., is outputting red light or some other light indicating that the sensor is disabled when, in fact, the sensor is enabled).

Referring back to FIGS. 5-10, a sensing state can persist over time, including when a computing device is powered off and restarted. Upon a restart, a controller can control the sensor to be in the sensing state. For instance, if prior to the restart, the sensing state was enabled, after the restart, the sensor is enabled. If prior to the restart, the sensing state was disabled, after the restart, the sensor is disabled. The sensing state can be persisted by, for instance, storing the corresponding sensing state data in data storage of the memory, where the data storage can be non-volatile computer memory storage medium, such as a Flash memory.

Various embodiments of the present disclosure are described in connection with a sensing state of a sensor and sensing state data. The sensing state is an example of a state of the sensor and the sensing state data is an example of state data that indicates whether a sensing state of a sensor is enabled or disabled. Embodiments of the present disclosure are not limited to sensing state and sensing state data and similarly apply to any type of state and/or any type of state data. For instance, a sensor can be controlled to be enabled or disabled, active or inactive (e.g., powered on and outputting sensor data, or powered on but its output is blanked), low power mode or high power mode (e.g., set to a particular voltage level or current draw that may impact the sensing capability), or low sensing range or a high sensing range (e.g., the specific sensing capability), and the like. State data can indicate each of these states.

Figure 11:
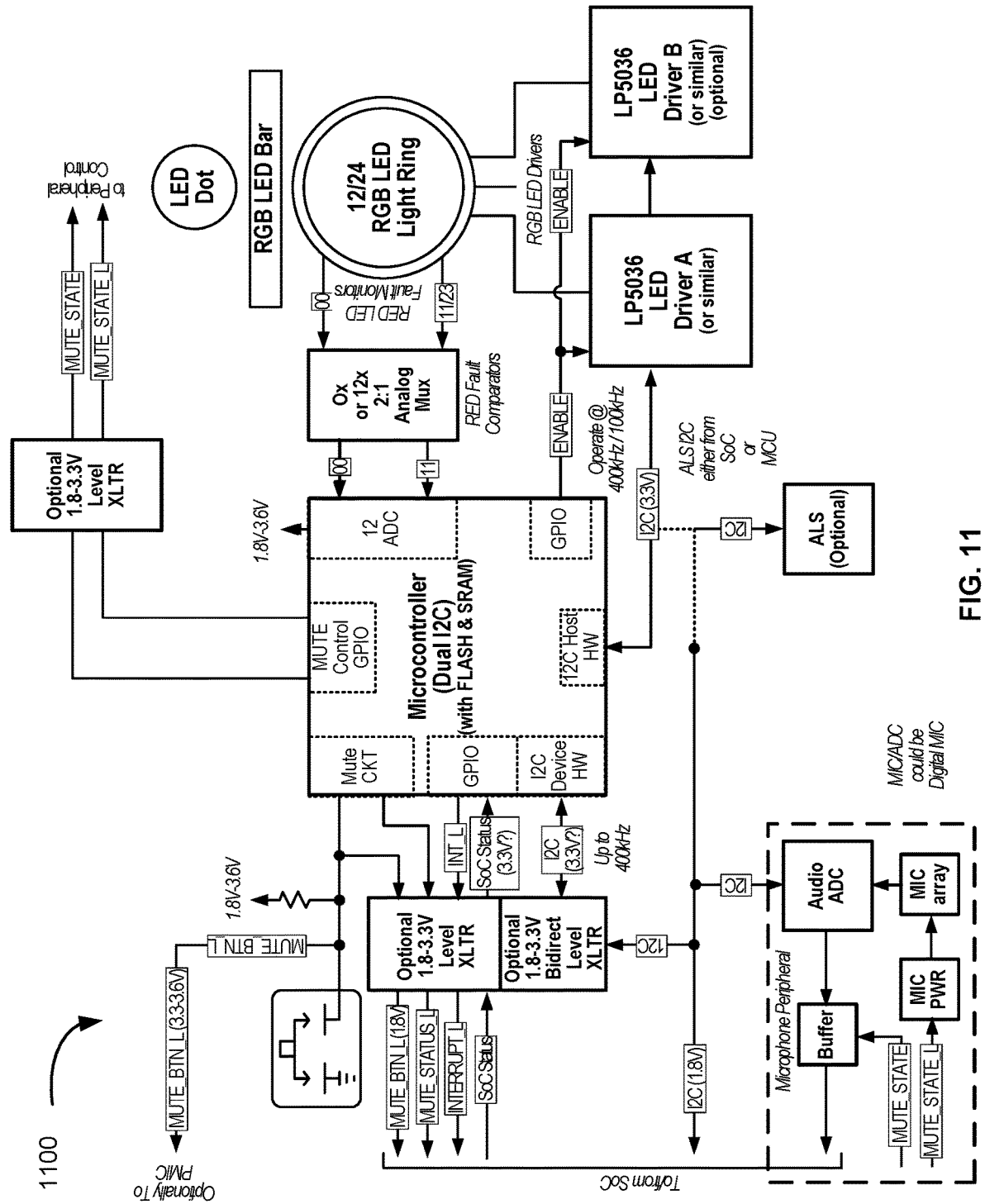
FIG. 11 illustrates an example of a diagram of a controller implemented as an interposer in a system, according to embodiments of the present disclosure.

FIG. 11 illustrates an example of a diagram of a controller implemented as an interposer in a system 1100, according to embodiments of the present disclosure. The controller can implement the logic described in connection with FIGS. 5-11. In the illustration of FIG. 11, the system 1100 includes a button, a microcontroller (which is an example of the controller), one or more LED drivers, a set of RGB LEDs (FIG. 11 illustrates four portions: a twelve RGB LED light ring, a twenty-four RFB LED light ring, an RGB LED bar, or an LED dot), a microphone peripheral, an ALS, a multiplexer, voltage level translators, and an SoC (the SoC is not shown in FIG. 11). The number of LED drivers can depend on the number of LEDs (for instance, one LED driver may support thirty-six LEDs or twelve RGB LEDs). The voltage level translators can be optional and can be used depending on the operational voltages of the different components. For instance, the microcontroller can be operated at 3.3 VDC, whereas the SoC and the microphone peripheral are operated at 1.8 VDC. In this case 1.8-3.3 VDC voltage level translators can be used.

In an example, the SoC is coupled with the microphone peripheral via an I2C bus. The microphone peripheral can include a buffer, an audio ADC, a microphone array, and a microphone power source. The SoC is also coupled with the microcontroller via an I2C bus with an optional 1.8-3.3 VDC voltage level translator in between. In this coupling, the microcontroller is a device and the SoC is a host. The microcontroller is also coupled with the LED driver(s) over an I2C bus. In this coupling, the microcontroller is a host and the coupled LED driver is a device. In addition, the microcontroller includes a general-purpose input/output (GPIO) that is coupled with the LED driver(s) and that is used to send an enable signal to the LED driver(s). The enable signal triggers the LED driver(s) to power up the set of LEDs.

Furthermore, the microcontroller includes a twelve port ADC that is coupled with the set of LEDs via a multiplexer. When twelve RGB LEDs are used, the multiplexer is a one-to-one multiplexer that couples each RGB LED with one of the twelve ports. When twenty four RGB LEDs are used, the multiplexer is a two-to-one multiplexer that couples pairs of RGB LEDs with the twelve ports. The ADC receives voltage values measured at the common cathode of the RGB LEDs and outputs a digital representation of these values as data that is further processed by the microcontroller for detecting light emission fault. The voltage values (or the resulting light source voltage data) is used as feedback data to detect light emission fault. The monitoring of the voltage values can be sequential or according to a pattern. Other variations are also possible. For instance, the microcontroller can include the same number of ADCs as the number of RGB LEDs. In this way, no multiplexer may be needed. Additionally, the voltage values can be monitored in parallel.

The microcontroller is also coupled with the button. A voltage pull-up resistor may be placed between the microcontroller and the button. In addition, the microcontroller can include a muting circuit to reduce noise and filter out edges of the mute button signal (shown as a "MUTE_BTN_L" in FIG. 11) received from the button upon activation thereof. The mute button signal can also be sent to the SoC, where the SoC and the button can be coupled, and where the coupling can include a 1.8-3.3 VDC voltage level translator in between.

In an example, the microcontroller can also include a GPIO that outputs an interrupt signal (shown as an "INTERRUPT_L" in FIG. 11) to the SoC when there is change to the sensing state that the microcontroller maintains (e.g., when the sensing state changes from enabled to disabled, or vice versa). The interrupt signal can be sent via a 1.8-3.3 VDC voltage level translator in between the SoC and the microcontroller. In response, the SoC can access a register of the microcontroller via the I2C bus to read the sensing state data. Additionally or alternatively, the microcontroller can send a sensing state status signal (shown as a "MUTE_STATUS_L" in FIG. 11), where this signal indicates the sensing state (e.g., enabled or disabled). From the SoC, the microcontroller can receive and SoC status signal (shown as an "SoC Status" in FIG. 11) indicating the operational status of the SoC (e.g., booting up, booted, etc.). The enable signal to the LED driver(s) can depend on the SoC status (e.g., the LED drivers are enabled upon the SoC completing the booting).

The microcontroller implements the logic described in connection with FIGS. 5-11 to control the microphone peripheral (and, similarly, other sensor peripherals) and the light emission. To control the microphone peripheral, the microcontroller can include a mute control GPIO that outputs one or more mute state signals (e.g., a first mute state signal, shown as a "MUTE_STATE" in FIG. 1, and a second mute state signal that is the invert of the first mute state signal, shown as a "MUTE_STATE_L" in FIG. 11).

Optionally, the ALS can be coupled with the microcontroller via an I2C bus. In this case, the intensity of the light emission can be controlled by the microcontroller based on the sensing of the ALS and can be indicated to the LED driver(s). Alternatively, the ALS can be coupled with the SoC via an I2C bus. In this case, the light intensity is controlled by the SoC.

In the illustration of FIG. 11, the microcontroller is implemented as an interposer by being coupled, as a device, with the SoC and by being coupled, as a host, with the LED driver. In this implementation, controls over the light emissions are within the realm of the microcontroller.

Figure 12:
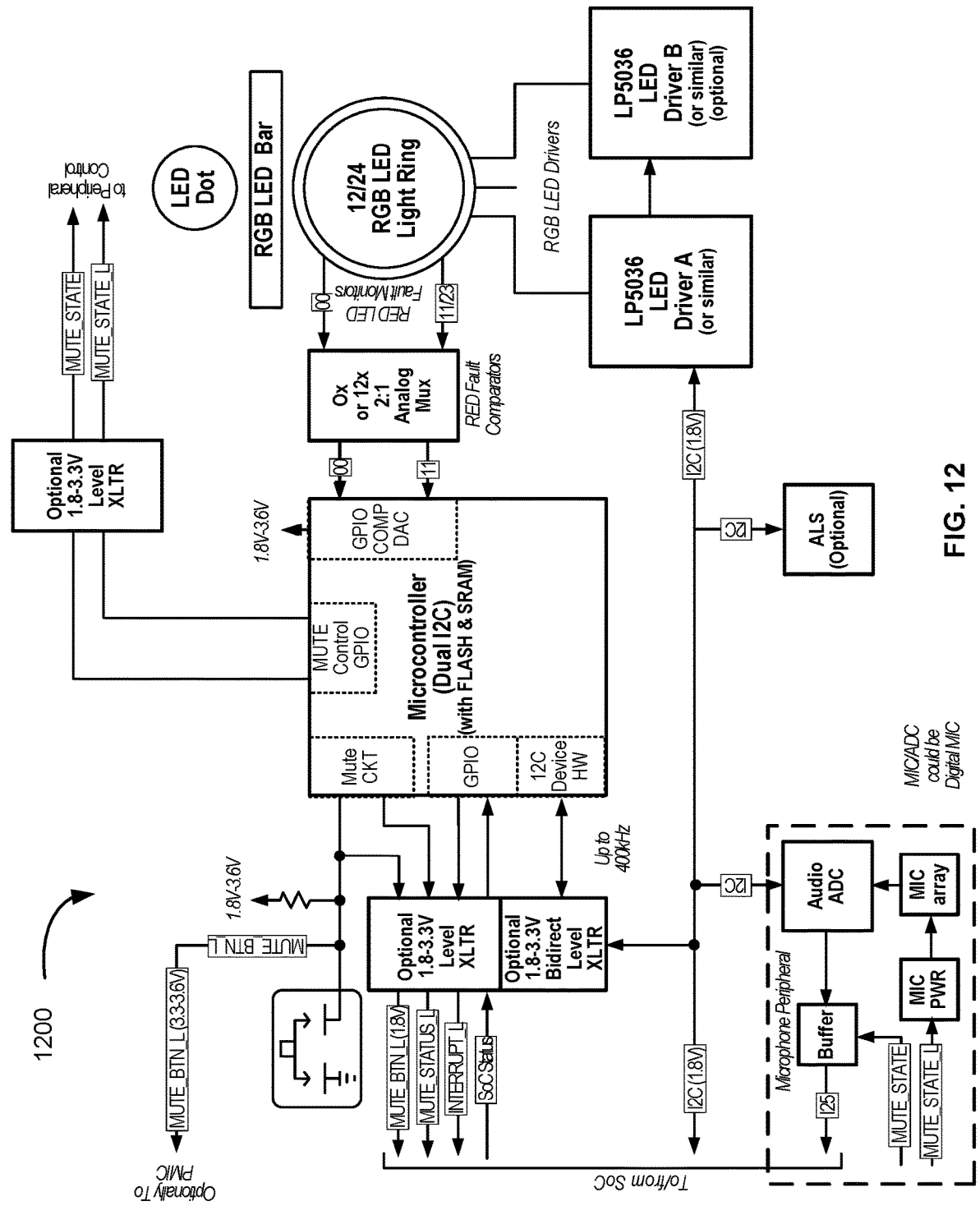
FIG. 12 illustrates an example of a diagram of a controller implemented as a passive sniffer in a system, according to embodiments of the present disclosure.

FIG. 12 illustrates an example of a diagram of a controller implemented as a passive sniffer in a system 1200, according to embodiments of the present disclosure. The controller can implement the logic described in connection with FIGS. 5-11. In the illustration of FIG. 1, the system 1200 includes a button, a microcontroller (which is an example of the controller), one or more LED drivers, a set of RGB LEDs, a microphone peripheral, an ALS, a multiplexer, voltage level translators, and an SoC (the SoC is not shown in FIG. 12). These components and the arrangement thereof, with the exception of the passive sniffer implementation, are similar to the ones shown in FIG. 11. In the interest of brevity, the similarities are not repeated herein and the applicable description of FIG. 11 equally applies herein. The difference is the passive sniffer implementation, where the microcontroller is coupled, as a device, with the SoC via an I2C bus, but is not coupled with the LED drivers. Instead, the SoC is coupled with LED drivers via an I2C bus.

Hence, in the passive sniffer configuration, the microcontroller does not send an enable signal to the LED driver(s) and does not send light emission controls to the LED drivers. The microcontroller retains control over the microphone peripheral (and, similarly, other sensors) and sends the mute state signal(s) via its mute control GPIO to effectuate this control. Nonetheless, light emission instructions to emit the particular light that indicates the disabling can be sent from the microcontroller to the SoC that then relays them to the LED drivers. Conversely, light emission instructions to stop the emission of particular light can be sent from the microcontroller to the SoC that then relays them to the LED drivers. The microcontroller does not arbitrate the light emission instructions from the SoC to the LED drivers and does not control the light intensity based on the sensing of the ALS.

Referring back to FIGS. 11 and 12, an interposer configuration and a passive sniffer configuration of a controller are illustrated. However, the embodiments of the present disclosure are not limited as such. Instead, other configurations of the controller are possible. For instance, an observer configuration can be implemented, where a controller is configured to determine a voltage values at a light source based and provide an indication of the voltage values to an SoC for a further action that can be triggered by the SoC. In one example of the observer configuration, the controller is not coupled with the SoC and a light source driver(s) via I2C buses. Instead, the controller may receive signals from the light source indicating voltage values at, for instance, cathodes of RGB LEDs, determine whether the voltage values indicate mute light emission, and send a signal to the SoC indicating the mute light emission when determined (e.g., an INTERUP_L signal). In another example of the observer configuration, the controller can also store sensing state data and use this data to determine a light emission fault. If the mute light emission is determined, but the sensing state data indicates an enabled sensing state, the controller can send a signal to the SoC indicating the light emission fault. In yet another example of the observer configuration, the controller may disable the sensor upon determining the light source emission fault and update the sensing state data to indicate that the sensor is disabled. For instance, the controller can be configured to send the MUTE_STATE and, optionally, MUTE_STATE_L signals to a gating peripheral of the sensor. In these examples, the controller can also send a signal to the SoC indicating the state of a button (e.g., activated or deactivated by using MUTE_BTN_L signal).

FIGS. 13-16 illustrate flows for controlling one or more sensors of a computing device and related light emission. The computing device can be any of the computing device 100 of FIG. 1 or the computing device 200 of FIG. 2. The operations of the flow can be performed by a controller of the computing device. The controller can be any of the controllers described herein above and can be implemented in an interposer configuration or a passive sniffer configuration.

Figure 13:
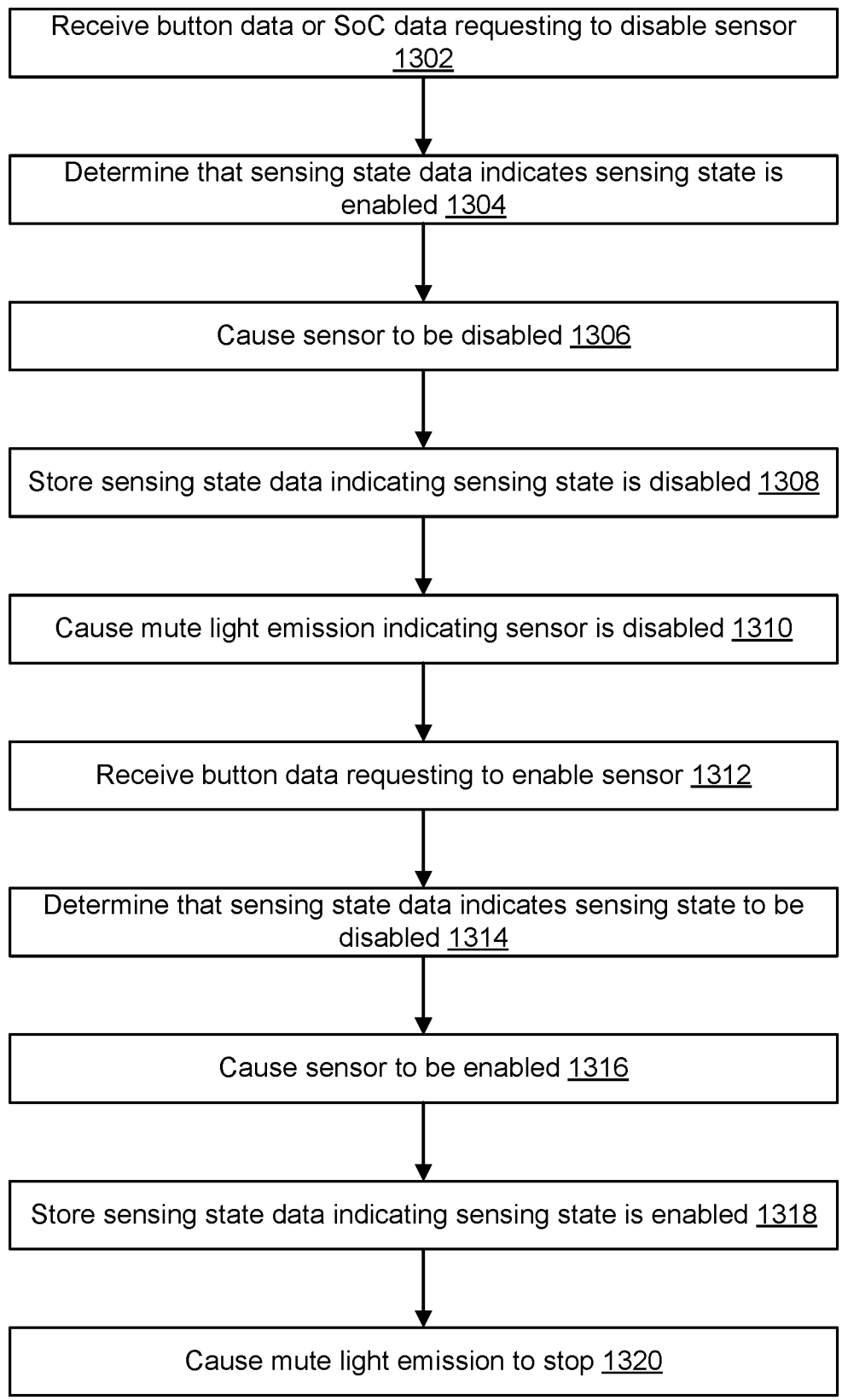
FIG. 13 illustrates an example of a flow for controlling a sensing state and light emission of a computing device, according to embodiments of the present disclosure.

FIG. 13 illustrates an example of a flow for controlling a sensing state and light emission of the computing device, according to embodiments of the present disclosure. Generally, the sensing state can be enabled or disabled. In the disabled sensing state, the sensor is powered off and its data output is blanked. In addition, a particular light is emitted (or other indicators are used) to indicate the disabled sensing state. In the enabled sensing state, the sensor is powered on and its data output is no longer blanked. In addition, the particular light emission is stopped (or other indicators are used) to indicate the enabled sensing state.

In an example, the flow starts at operation 1302, where the controller receives, at a first time, button data or SoC data requesting the sensor to be disabled. The button data is input data received upon a button activation. The SoC data is also input data received upon an execution of a program code that requests the disabling.

At operation 1304, the controller determines that sensing state data stored in a memory of the controller indicates that the sensing state is currently enabled. For instance, the controller reads the sensing state data from the memory in response to receiving the button data or the SoC data. In the case of a microphone, the sensing state data can be referred to as mute state data.

At operation 1306, the controller causes the sensor to be disabled. For instance, based on the sensing state being enabled and based on receiving the button data or the SoC data, the controller determines that the sensor is to be disabled. The controller can send output data to a gating peripheral, such as a switch set as described in FIGS. 3 and 4, to power off the sensor and blanket its data output.

At operation 1308, the controller stores sensing state data indicating that the sensing state is disabled. For instance, the controller generates updated sensing state data that indicates that the sensing state is set to disabled and that is stored in lieu of or in addition to the previously stored sensing state data. The controller can also send status data to the SoC indicating that the sensor is disabled (or, equivalently, indicating the disabled sensing state). The status data is an example of output data and can include the updated sensing state data or an interrupt that causes the SoC to read the updated sensing state data from the controller.

At operation 1310, the controller causes mute light emission indicating that the sensor is disabled (or, equivalently that the sensing state is set to disabled). For instance, the controller causes the light source to output a light pattern that indicates the disabled sensing state. In an interposer configuration, the controller sends output data to an LED driver (e.g., light data), where this data includes an instruction about outputting a light pattern that includes emitting light of a single color or a combination of two or more colors, varying intensities of light, blinking lights, steady light, combination of blinking and steady light, and the like, where this light pattern can correspond to mute light emission. In a passive sniffer configuration, the controller sends output data to the SoC that can relay it to an LED driver, where this data includes an instruction about the mute light emission.

At operation 1312, the controller receives, at a second time, button data requesting the sensor to be enabled. The button data is input data received upon another button activation.

At operation 1314, the controller determines that the sensing state data stored in the memory indicates that the sensing state is currently disabled. For instance, the controller reads the sensing state data from the memory in response to receiving the button data.

At operation 1316, the controller causes the sensor to be enabled. For instance, based on the sensing state being disabled and based on receiving the button data, the controller determines that the sensor is to be enabled. The controller can send output data to the gating peripheral to power on the sensor and stop the blanketing of its data output.

At operation 1318, the controller stores sensing state data indicating that the sensing state is enabled. For instance, the controller generates updated sensing state data that indicates that the sensing state is set to enabled and that is stored in lieu of or in addition to the previously stored sensing state data. The controller can also send status data to the SoC indicating that the sensor is enabled (or, equivalently, indicating the enabled sensing state). The status data is an example of output data and can include the updated sensing state data or an interrupt that causes the SoC to read the updated sensing state data from the controller.

At operation 1320, the controller causes the mute light emission indicating that the sensor is enabled (or, equivalently that the sensing state is set to disabled) to stop. For instance, in the interposer configuration, the controller sends output data to the LED driver, where this data includes an instruction to stop the light emission. In the passive sniffer configuration, the controller sends output data to the SoC that can relay it to an LED driver, where this data includes the instruction.

Figure 14:
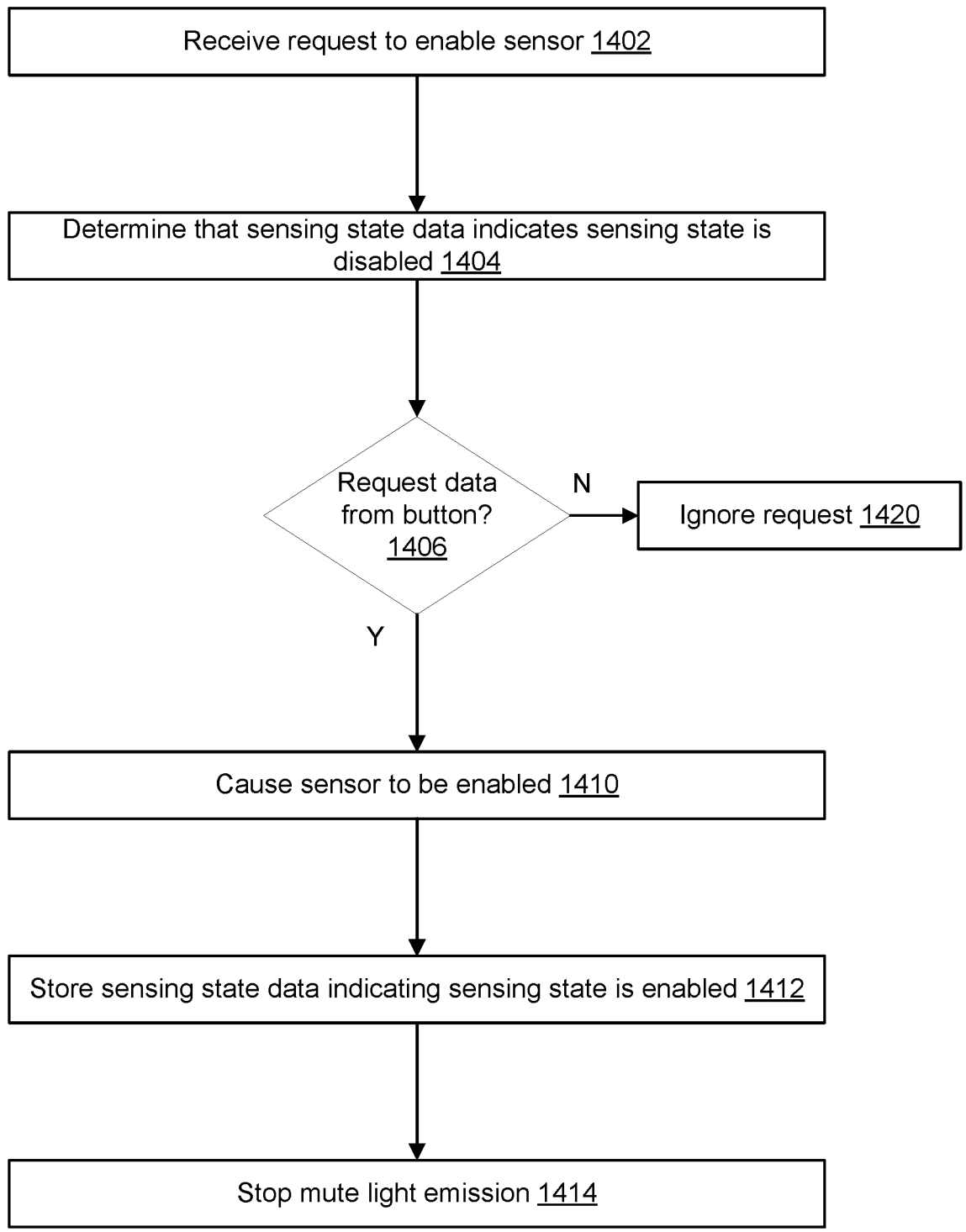
FIG. 14 illustrates an example of a flow for enabling a sensor of a computing device, according to embodiments of the present disclosure.

FIG. 14 illustrates an example of a flow for enabling the sensor of the computing device, according to embodiments of the present disclosure. Here, the sensor is disabled. Re-enabling it can depend on the source requesting the re-enablement. If the source is the button, the sensor can be re-enabled. However, if the source is the SoC, the sensor is not re-enabled.

In an example, the flow starts at operation 1402, where the controller receives a request to enable the sensor. The request can be button data received upon a button activation or SoC data received upon an execution of a program code that requests the enabling.

At operation 1404, the controller determines that the sensing state data stored in the memory indicates that the sensing state is currently disabled. For instance, the controller reads the sensing state data from the memory in response to receiving the request.

At operation 1406, the controller determines whether the request originated from the button. If so, operation 1410 follows operation 1406. Otherwise, operation 1420 follows operation 1406, whereby the request is ignored and the sensing state is unchanged. The determination can depend on the port by which the request is received. If the port couples the controller to the button, the request is determined to be from the button. If the port couples the controller with the SoC, the request is determined to be from the SoC.

At operation 1410, the controller causes the sensor to be enabled. For instance, based on the sensing state being disabled and based on receiving the button data, the controller determines that the sensor is to be enabled. The controller can send output data to the gating peripheral to power on the sensor and stop the blanketing of its data output.

At operation 1412, the controller stores sensing state data indicating that the sensing state is enabled. For instance, the controller generates updated sensing state data that indicates that the sensing state is set to enabled and that is stored in lieu of or in addition to the previously stored sensing state data.

At operation 1414, the controller causes the mute light emission indicating that the sensor is disabled (or, equivalently that the sensing state is set to disabled) to stop. For instance, in the interposer configuration, the controller sends output data to the LED driver, where this data includes an instruction to stop the mute light emission. In the passive sniffer configuration, the controller sends output data to the SoC that can relay it to an LED driver, where this data includes the instruction.

Figure 15:
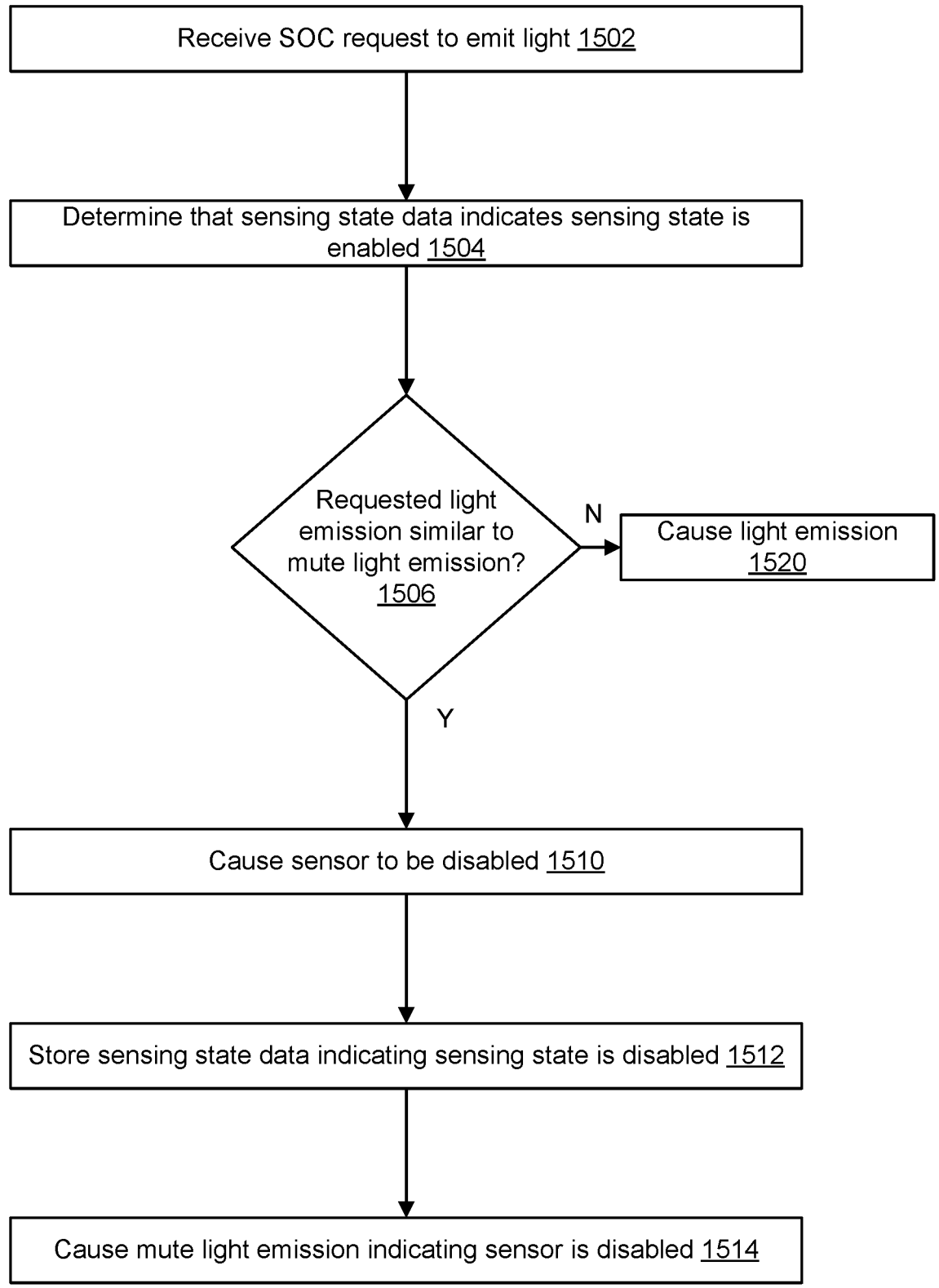
FIG. 15 illustrates an example of a flow for controlling a sensing state of a computing device based on a light emission request, according to embodiments of the present disclosure.

FIG. 15 illustrates an example of a flow for controlling the sensing state of the computing device based on a light emission request, according to embodiments of the present disclosure. Here, the SoC can send the light emission request to the controller and the controller can process this request by determining the similarity of the requested light emission to the light emission used to indicate that the disabled sensing state. Generally, this type of controller may be available in the interposer configuration but not the passive sniffer configuration.

In an example, the flow starts at operation 1502, where the controller receives an SOC request to emit light. For instance, the SoC sends request data indicating a request for light emission. This data one or more parameters that define attributes of the requested light emission (e.g., RGB value, current value, and/or PMW percentage values, etc.).

At operation 1504, the controller determines that the sensing state data stored in the memory indicates that the sensing state is currently enabled. For instance, the controller reads the sensing state data from the memory in response to receiving the request.

At operation 1506, the controller determines whether the requested light emission would indicate that the sensor is disabled. The determination can depend on the similarity comparison between the requested light emission and the mute light emission used to indicate the disabled sensing state, as described in FIG. 9. If the two light emissions are similar, operation 1510 follows operation 1506. Otherwise, operation 1520 follows operation 1506.

At operation 1510, the controller causes the sensor to be disabled. For instance, the controller can send output data to the gating peripheral to power off the sensor and blanket its data output.

At operation 1512, the controller stores sensing state data indicating that the sensing state is disabled. For instance, the controller generates updated sensing state data that indicates that the sensing state is set to disabled and that is stored in lieu of or in addition to the previously stored sensing state data.

At operation 1514, the controller causes mute light emission indicating that the sensor is disabled (or, equivalently that the sensing state is set to disabled). For instance, in the interposer configuration, the controller sends output data to the LED driver, where this data includes an instruction about the mute light emission and, optionally, about the light intensity. The light emission can be the requested light emission or can be the light emission predefined for the use to indicate the disabled sensing state.

At operation 1520, the controller causes the light emission. Here, the light emission is the requested light emission and is not similar to the one used to indicated the disabled sensing state. In the interposer configuration, the controller sends output data to the LED driver, where this data includes an instruction about the light emission and, optionally, about the light intensity.

Figure 16:
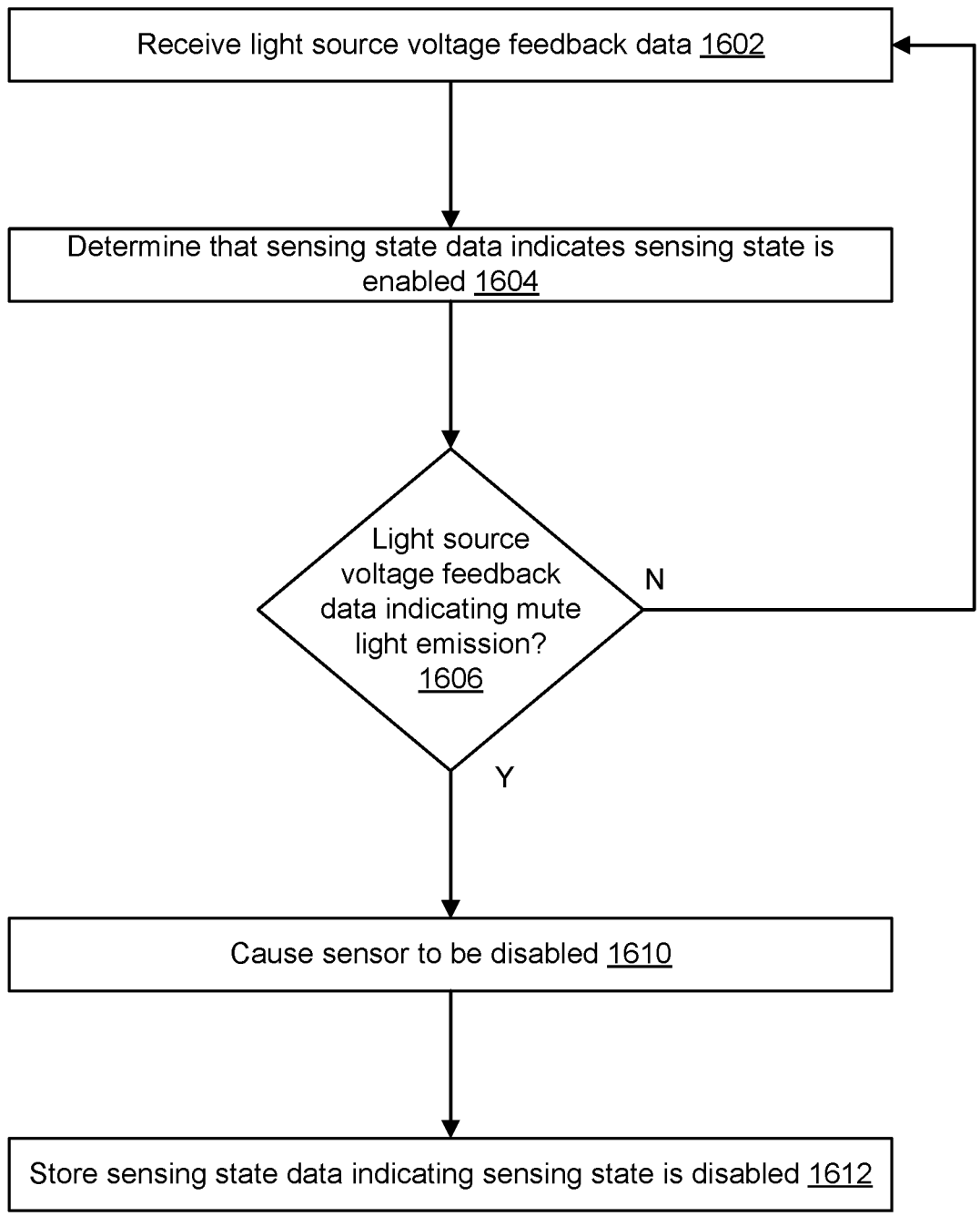
FIG. 16 illustrates an example of a flow for controlling a sensing state of a computing device based on light source voltage feedback, according to embodiments of the present disclosure.

FIG. 16 illustrates an example of a flow for controlling the sensing state of the computing device based on light source voltage feedback, according to embodiments of the present disclosure. The controller can receive data from a light source, referred to herein as light source voltage feedback data, indicating voltage values measured at the light source, such as cathodes of LEDs or RGB LEDs. The voltage values can be compared to voltage range data, as described in FIG. 10, to detect a light emission fault. If such a fault is detected, the sensor is disabled.

In an example, the flow starts at operation 1602, where the controller receives light source voltage feedback data. For instance, the controller includes one or more ADCs that are coupled with the light source. An ADC receives from the light source an input signal indicating a voltage value at the light source. Output data of the ADC includes light source voltage feedback data that indicates the voltage value for further processing by the controller.

At operation 1604, the controller determines that the sensing state data stored in the memory indicates that the sensing state is currently enabled. For instance, the controller reads the sensing state data from the memory in response to receiving the request.

At operation 1606, the controller determines whether a light emission is occurring and indicates that the sensor is disabled. The determination can involve a comparison of the voltage values indicated by the light source voltage feedback data to voltage value ranges indicated by the voltage range data stored in the memory of the controller, as described in FIG. 10. If the comparison indicates that the light source is likely emitting light that indicates the disabled sensing state, the controller can declare a fault and operation 1610 follows operation 1606. Otherwise, the flow loops back to operation 1602 to continue the monitoring of the voltage values. As indicated herein above, other types of light source data can be received and processed to determine whether the light source is operating in a failure mode. For instance, the light source data can indicate electrical current values and/or electrical power values that can be compared to value range(s) of a normal mode. If outside the range(s), the failure mode is determined and operation 1610 can be performed.

At operation 1610, the controller causes the sensor to be disabled. For instance, the controller can send output data to the gating peripheral to power off the sensor and blanket its data output.

At operation 1612, the controller stores sensing state data indicating that the sensing state is disabled. For instance, the controller generates updated sensing state data that indicates that the sensing state is set to disabled and that is stored in lieu of or in addition to the previously stored sensing state data.

Figure 17:
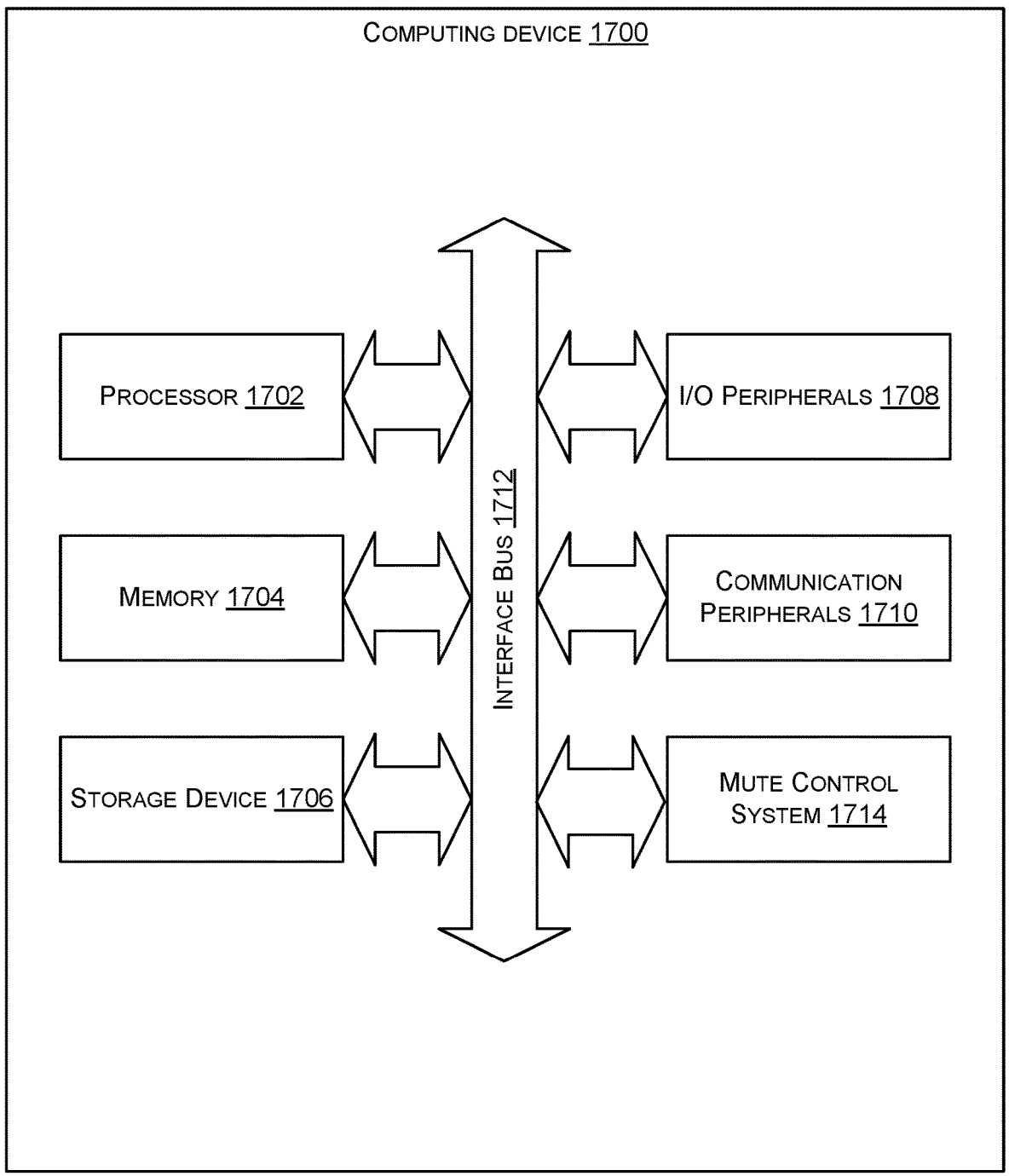
FIG. 17 illustrates an example of an architecture of a computing device that includes mute control circuitry, according to embodiments of the present disclosure.

FIG. 17 illustrates an example of an architecture of a computing device 1700 that includes mute control system 1714, according to embodiments of the present disclosure. The mute control system 1714 can include a button, a controller, and one or more switch sets similar to the components of the computing devices described herein above. Although the components of the computing device 1700 are illustrated as belonging to a same computing device 1700, the computing device 1700 can also be distributed (e.g., between multiple user devices).

The computing device 1700 includes at least a processor 1702, a memory 1704, a storage device 1706, input/output peripherals (I/O) 1708, communication peripherals 1710, an interface bus 1712, and the mute control system 1714. The interface bus 1712 is configured to communicate, transmit, and transfer data, controls, and commands among the various components of the computing device 1700. The memory 1704 and the storage device 1706 include computer-readable storage media, such as RAM, ROM, electrically erasable programmable read-only memory (EEPROM), hard drives, CD-ROMs, optical storage devices, magnetic storage devices, electronic non-volatile computer storage, for example Flash® memory, and other tangible storage media. Any of such computer readable storage media can be configured to store instructions or program codes embodying aspects of the disclosure. The memory 1704 and the storage device 1706 also include computer readable signal media. A computer readable signal medium includes a propagated data signal with computer readable program code embodied therein. Such a propagated signal takes any of a variety of forms including, but not limited to, electromagnetic, optical, or any combination thereof. A computer readable signal medium includes any computer readable medium that is not a computer readable storage medium and that can communicate, propagate, or transport a program for use in connection with the computing device 1700.

Further, the memory 1704 includes an operating system, programs, and applications. The processor 1702 is configured to execute the stored instructions and includes, for example, a logical processing unit, a microprocessor, a digital signal processor, and other processors. The memory 1704 and/or the processor 1702 can be virtualized and can be hosted within another computing device of, for example, a cloud network or a data center. The I/O peripherals 1708 include user interfaces, such as a keyboard, screen (e.g., a touch screen), microphone, speaker, other input/output devices, and computing components, such as graphical processing units, serial ports, parallel ports, universal serial buses, and other input/output peripherals. The I/O peripherals 1708 are connected to the processor 1702 through any of the ports coupled to the interface bus 1712. The communication peripherals 1710 are configured to facilitate communication between the computing device 1700 and other computing devices over a communication network and include, for example, a network interface controller, modem, wireless and wired interface cards, antenna, and other communication peripherals.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multipurpose microprocessor-based computing devices accessing stored software that programs or configures the portable device from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another, or may be combined in various ways. All possible combinations and sub-combinations are intended to fall within the scope of the present disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

What is claimed is:

1. A device, comprising:
   a button;
   a microphone;
   a light source that comprises a plurality of light emitting diodes (LEDs);
   a LED driver coupled with the light source;
   a processor; and
   a controller coupled with the processor and the LED driver, the controller configured to:
      store first state data indicating a state of the microphone, the first state data indicating that the microphone is enabled;
      receive, from the button at a first time, first button data indicating a request to disable the microphone;
      determine, based on the first state data, that the microphone is enabled;
      cause the microphone to be disabled;
      store second state data indicating that the microphone is disabled;
      send, to the LED driver, first LED data that causes the light source to output a first light pattern, the first light pattern indicating that the microphone is disabled; and
      send, to the processor, status data indicating that the microphone is disabled.

2. The device of claim 1, wherein the controller comprises an analog-to-digital converter (ADC) that is coupled with the light source, and wherein the controller is further configured to:
   determine, at a second time, that the microphone is enabled;
   store third state data indicating that the microphone is enabled;
   send, to the LED driver, second LED data that causes the light source to stop outputting the first light pattern;
   receive, by the ADC and from the light source, an input signal indicating a voltage value at the light source;
   determine, from output data of the ADC, that the light source is outputting the first light pattern; and
   cause the microphone to be disabled.

3. The device of claim 1, wherein the controller is further configured to:
   determine, at a second time, that the microphone is enabled;
   send, to the LED driver, second LED data that causes the light source to stop emitting the first light pattern;
   receive, from the processor, a request indicating a second light pattern;
   determine a similarity between the second light pattern and the first light pattern;
   send, to the LED driver based on the similarity, third LED data that causes the light source to output the first light pattern or the second light pattern; and
   cause the microphone to be disabled.

4. A method, the method comprising:
   storing, by a controller of a device, first state data indicating a state of a sensor configured to generate sensor data;
   receiving, by the controller, first input data indicating a request to disable the sensor;
   determining, by the controller based at least in part on the first state data, that the sensor is enabled;
   causing, by the controller, the sensor to be disabled;
   storing, by the controller, second state data indicating that the sensor is disabled; and
   sending, by the controller to a processor of the device configured to generate processed data by processing the sensor data and execute an application that receives the processed data, first output data indicating that the sensor is disabled, the controller being separate from and coupled with the processor.

5. The method of claim 4, further comprising:
   sending, by the controller to a light source driver, second output data that causes a light source coupled with the light source driver to output a light pattern, the light pattern indicating that the sensor is disabled;
   receiving, by the controller from a button, second input data indicating a request to enable the sensor;
   causing, by the controller, the sensor to be enabled;
   storing, by the controller, third state data indicating that the sensor is enabled; and
   sending, by the controller, to the light source driver, third output data that causes the light source to stop outputting the light pattern.

6. The method of claim 4, further comprising:
   receiving, by the controller from a button, second input data indicating a request to enable the sensor;
   determining, by the controller based at least in part on the second state data, that the sensor is disabled;
   causing, by the controller based at least in part on the second input data and the second state data, the sensor to be enabled; and storing, by the controller in a memory of the controller, third state data indicating that the sensor is enabled.

7. The method of claim 4, further comprising:
receiving, by the controller from the processor, second input data indicating a request to enable the sensor;
determining, by the controller based at least in part on the second state data, that the sensor is disabled; and
ignoring the request.

8. The method of claim 4, further comprising:
causing, by the controller based at least in part on the sensor being disabled, a light source to output a first light pattern indicating that the sensor is disabled;
causing, by the controller, the sensor to be enabled at a different time;
storing, by the controller, third state data indicating that the sensor is enabled;
receiving, by the controller from the light source, light source data;
determining, by the controller based at least in part on the light source data, that the light source is emitting a second light pattern that indicates that the sensor is disabled;
causing, by the controller, the sensor to be disabled; and
storing, by the controller, fourth state data indicating that the sensor is disabled.

9. The method of claim 4, further comprising:
causing, by the controller based at least in part on the sensor being disabled, a light source to output a first light pattern indicating that the sensor is disabled;
causing, by the controller, the sensor to be enabled;
receiving, by the controller from the light source, light source data;
determining, by the controller based at least in part on the light source data, that the light source is operating in a failure mode; and
causing, by the controller, the sensor to be disabled.

10. The method of claim 4, further comprising:
causing, by the controller, the sensor to be enabled;
receiving, by the controller from the processor, second input data requesting a light pattern to be output by a light source;
determining, by the controller, that the light pattern indicates the sensor is disabled;
causing, by the controller, the light source to output the light pattern; and
causing, by the controller, the sensor to be disabled.

11. A device comprising:
a processor configured to receive sensor data, generate processed data based at least in part on the sensor data, and execute an application that uses the processed data; and
a controller separate from and coupled with the processor and configured to:
store first state data indicating a state of a sensor configured to generate the sensor data, the state being enabled;
receive first input data indicating a request to disable the sensor;
determine, based at least in part on the first state data, that the sensor is enabled;
cause the sensor to be disabled;
store second state data indicating that the sensor is disabled; and
send, to the processor, first output data indicating that the sensor is disabled.

12. The device of claim 11, further comprising:
a light source; and
a light source driver that is coupled with the light source,
wherein the controller is coupled with the processor via a first inter-integrated circuit (I2C) bus, and wherein the processor is coupled with the light source driver via a second I2C bus.

13. The device of claim 11, further comprising:
a light source; and
a light source driver that is coupled with the light source,
wherein the controller is coupled with the processor via a first I2C bus and is coupled with the light source driver via a second I2C bus.

14. The device of claim 11, further comprising:
a light source; and
a light source driver that is coupled with the light source,
wherein the controller is coupled with the light source driver and is further configured to send an enable signal to the light source driver.

15. The device of claim 11, further comprising:
a light source coupled with the controller,
wherein the controller is further configured to:
cause the sensor to be enabled;
store third state data indicating that the sensor is enabled;
receive, from the light source, light source data;
determine, based at least in part on the light source data, that the light source is emitting a light pattern that indicates the sensor is disabled; and
cause the sensor to be disabled.

16. The device of claim 15, wherein the light source comprises a plurality of red, blue, green (RGB) light emitting diodes (LEDs), wherein the controller comprises a plurality of analog-to-digital converters (ADCs), wherein each ADC is coupled with a different RGB LED, and wherein an input signal is received by an ADC from an RGB LED.

17. The device of claim 15, wherein the light source comprises a plurality of red, blue, green (RGB) light emitting diodes (LEDs), wherein the controller comprises an analog-to-digital converters (ADC) coupled with the RGB LEDs, and wherein an input signal is received by an ADC from an RGB LED.

18. The device of claim 11, further comprising:
a light source;
a light source driver coupled with the controller and the light source; and
an ambient light sensor (ALS) coupled with the controller,
wherein the controller is further configured to:
receive second input data from the ALS, the second input data indicating light intensity; and
send, to the light source driver, second output data indicating a light pattern and the light intensity, the light pattern indicating that the sensor is disabled.

19. The device of claim 11, further comprising:
a light source; and
a light source driver coupled with the light source;
wherein the processor is configured to:
receive, based at least in part on the first output data, the second state data
indicating that the sensor is disabled, and
wherein at least one of the processor or the sensor is configured to send, based at least in part on the second state data, second output data to the light source driver, the second output data causing the light source to output a light pattern indicating that the sensor is disabled.

20. The method of claim 4, further comprising:
sending, by the controller to a light source driver, second output data that causes a light source coupled with the light source driver to output a light pattern, the light pattern indicating that the sensor is disabled.

\* \* \* \* \*